(12) United States Patent
Demaray et al.

(10) Patent No.: US 7,469,558 B2
(45) Date of Patent: Dec. 30, 2008

(54) AS-DEPOSITED PLANAR OPTICAL WAVEGUIDES WITH LOW SCATTERING LOSS AND METHODS FOR THEIR MANUFACTURE

(75) Inventors: Richard E. Demaray, Portola Valley, CA (US); Kai-An Wang, Cupertino, CA (US); Ravi B. Mullapudi, San Jose, CA (US); Qing Zhu, San Jose, CA (US); Hongmei Zhang, San Jose, CA (US); Harold D. Ackler, Sunnyvale, CA (US); John C. Egermeier, San Jose, CA (US); Rajiv Pethe, San Jose, CA (US)

(73) Assignee: SpringWorks, LLC, Minnetonka, MN (US)

( * ) Notice: Subject to any disclaimer, the term of this patent is extended or adjusted under 35 U.S.C. 154(b) by 200 days.

(21) Appl. No.: 09/903,081

(22) Filed: Jul. 10, 2001

(65) Prior Publication Data

US 2003/0063883 A1 Apr. 3, 2003

(51) Int. Cl.
*C03C 17/02* (2006.01)
*C03C 17/34* (2006.01)
(52) U.S. Cl. .............. 65/386; 65/429; 65/391
(58) Field of Classification Search ............ 65/386, 65/391, 429
See application file for complete search history.

(56) References Cited

U.S. PATENT DOCUMENTS 3,309,302 A 3/1967 Heil (Continued)

FOREIGN PATENT DOCUMENTS

EP 0 510 883 A2 10/1992

(Continued)

OTHER PUBLICATIONS

Asghari et al., "ASOC—A Manufacturing Integrated Optics Technology," Part of the SPIE Conference on Integrated Optics Devices III, SPIE vol. 3620, pp. 252-262 (Jan. 1999).

(Continued)

*Primary Examiner*—John Hoffmann
(74) *Attorney, Agent, or Firm*—Finnegan, Henderson, Farabow, Garrett & Dunner, L.L.P.

(57) ABSTRACT

An as-deposited waveguide structure is formed by a vapor deposition process without etching of core material. A planar optical device of a lighthouse design includes a ridge-structured lower cladding layer of a low refractive index material. The lower cladding layer has a planar portion and a ridge portion extending above the planar portion. A core layer of a core material having a higher refractive index than the low refractive index material of the lower cladding layer overlies the top of the ridge portion of the lower cladding. A slab layer of the core material overlies the planar portion of the lower cladding layer. The lighthouse waveguide also includes a top cladding layer of a material having a lower refractive index than the core material, overlying the core layer and the slab layer. A method of forming an as-deposited waveguide structure includes first forming a ridge structure in a layer of low refractive index material to provide a lower cladding layer. Next a layer of core material is deposited over the ridge structure by a vapor deposition process. Finally, a top cladding layer of a material having a lower refractive index than the core material is deposited over the core layer.

12 Claims, 4 Drawing Sheets

U.S. PATENT DOCUMENTS

| | | | |
|---|---|---|---|
| 3,616,403 A * | 10/1971 | Collins et al. ............ 204/192.22 |
| 3,850,604 A * | 11/1974 | Klein .......................... 65/32.5 |
| 4,082,569 A | 4/1978 | Evans, Jr. |
| 4,111,523 A * | 9/1978 | Kaminow et al. ............... 385/14 |
| 4,437,966 A | 3/1984 | Hope et al. .................. 204/298 |
| 4,587,225 A | 5/1986 | Tsukuma et al. |
| 4,619,680 A * | 10/1986 | Nourshargh et al. ........... 65/386 |
| RE32,449 E | 6/1987 | Claussen |
| 4,710,940 A | 12/1987 | Sipes, Jr. |
| 4,785,459 A | 11/1988 | Baer |
| 4,915,810 A | 4/1990 | Kestigian et al. ........ 204/298.04 |
| 4,978,437 A | 12/1990 | Wirz .......................... 204/192 |
| 5,085,904 A | 2/1992 | Deak et al. ................. 428/35.7 |
| 5,107,538 A | 4/1992 | Benton et al. ............... 385/130 |
| 5,119,460 A | 6/1992 | Bruce et al. ................. 385/142 |
| 5,173,271 A | 12/1992 | Chen et al. |
| 5,174,876 A | 12/1992 | Buchal et al. ............... 427/526 |
| 5,196,041 A * | 3/1993 | Tumminelli et al. ............ 65/386 |
| 5,200,029 A | 4/1993 | Bruce et al. ................. 156/657 |
| 5,206,925 A | 4/1993 | Nakazawa et al. ........... 385/142 |
| 5,225,288 A | 7/1993 | Beeson et al. ............. 428/475.5 |
| 5,237,439 A | 8/1993 | Misono et al. ................. 359/74 |
| 5,252,194 A | 10/1993 | Demaray et al. .......... 204/298.2 |
| 5,287,427 A * | 2/1994 | Atkins et al. ................ 385/124 |
| 5,296,089 A | 3/1994 | Chen et al. |
| 5,303,319 A | 4/1994 | Ford et al. ................... 385/131 |
| 5,306,569 A | 4/1994 | Hiraki |
| 5,309,302 A | 5/1994 | Vollmann |
| 5,338,625 A | 8/1994 | Bates et al. |
| 5,355,089 A | 10/1994 | Treger |
| 5,381,262 A | 1/1995 | Arima et al. ................. 359/341 |
| 5,427,669 A | 6/1995 | Drummond ............... 204/298.2 |
| 5,457,569 A | 10/1995 | Liou et al. ................... 359/344 |
| 5,475,528 A | 12/1995 | LaBorde ...................... 359/341 |
| 5,478,456 A | 12/1995 | Humpal et al. |
| 5,483,613 A | 1/1996 | Bruce et al. ................. 385/129 |
| 5,499,207 A | 3/1996 | Miki et al. |
| 5,538,796 A | 7/1996 | Schaffer et al. |
| 5,555,127 A | 9/1996 | Abdelkader et al. ......... 359/341 |
| 5,561,004 A | 10/1996 | Bates et al. |
| 5,563,979 A | 10/1996 | Bruce et al. ................. 385/142 |
| 5,565,071 A | 10/1996 | Demaray et al. ........ 204/192.12 |
| 5,591,520 A | 1/1997 | Migliorini et al. |
| 5,603,816 A | 2/1997 | Demaray et al. ........ 204/298.07 |
| 5,607,560 A | 3/1997 | Hirabayashi et al. ... 204/192.15 |
| 5,607,789 A | 3/1997 | Treger et al. ................... 429/90 |
| 5,613,995 A | 3/1997 | Bhandarkar et al. ........... 65/384 |
| 5,645,626 A | 7/1997 | Edlund et al. |
| 5,654,054 A | 8/1997 | Tropsha et al. .............. 428/36.6 |
| 5,654,984 A | 8/1997 | Hershbarger et al. ........ 375/257 |
| 5,686,360 A | 11/1997 | Harvey, III et al. |
| 5,689,522 A | 11/1997 | Beach |
| 5,693,956 A | 12/1997 | Shi et al. ....................... 257/40 |
| 5,702,829 A | 12/1997 | Paidassi et al. |
| 5,718,813 A | 2/1998 | Drummond et al. .... 204/192.12 |
| 5,719,976 A | 2/1998 | Henry et al. ................... 385/50 |
| 5,731,661 A | 3/1998 | So et al. |
| 5,738,731 A | 4/1998 | Shindo et al. |
| 5,755,938 A | 5/1998 | Fukui et al. ............. 204/298.23 |
| 5,757,126 A | 5/1998 | Harvey, III et al. |
| 5,762,768 A | 6/1998 | Goy et al. |
| 5,771,562 A | 6/1998 | Harvey, III et al. |
| 5,792,550 A | 8/1998 | Phillips et al. ............... 428/336 |
| 5,811,177 A | 9/1998 | Shi et al. |
| 5,830,330 A | 11/1998 | Lantsman .............. 204/192.12 |
| 5,831,262 A | 11/1998 | Greywall et al. ........ 250/227.14 |
| 5,841,931 A | 11/1998 | Foresi et al. ................. 385/131 |
| 5,847,865 A | 12/1998 | Gopinath et al. ............ 359/343 |
| 5,849,163 A | 12/1998 | Ichikawa et al. ........ 204/192.23 |
| 5,853,830 A | 12/1998 | McCaulley et al. ........ 428/35.7 |
| 5,855,744 A | 1/1999 | Halsey et al. ........... 204/192.12 |
| 5,870,273 A | 2/1999 | Sogabe et al. |
| 5,882,946 A | 3/1999 | Otani |
| 5,900,057 A | 5/1999 | Buchal et al. ................ 117/109 |
| 5,909,346 A * | 6/1999 | Malhotra et al. ............. 360/126 |
| 5,930,046 A | 7/1999 | Solberg et al. |
| 5,930,584 A | 7/1999 | Sun et al. |
| 5,942,089 A | 8/1999 | Sproul et al. ........... 204/192.13 |
| 5,948,215 A | 9/1999 | Lantsman ............... 204/192.12 |
| 5,952,778 A | 9/1999 | Haskal et al. |
| 5,961,682 A | 10/1999 | Lee et al. ....................... 65/384 |
| 5,966,491 A | 10/1999 | DiGiovanni ................. 385/127 |
| 5,977,582 A | 11/1999 | Fleming et al. .............. 257/310 |
| 6,000,603 A * | 12/1999 | Koskenmaki et al. ........ 228/246 |
| 6,001,224 A | 12/1999 | Drummond et al. .... 204/192.12 |
| 6,004,660 A | 12/1999 | Topolski et al. |
| 6,024,844 A | 2/2000 | Drummond et al. .... 204/192.12 |
| 6,045,626 A | 4/2000 | Yano et al. |
| 6,046,081 A | 4/2000 | Kuo |
| 6,051,114 A | 4/2000 | Yao et al. .................. 204/192.3 |
| 6,051,296 A | 4/2000 | McCaulley et al. ......... 428/35.7 |
| 6,052,397 A | 4/2000 | Jeon et al. |
| 6,057,557 A | 5/2000 | Ichikawa ....................... 257/59 |
| 6,058,233 A | 5/2000 | Dragone ....................... 385/46 |
| 6,071,323 A | 6/2000 | Kawaguchi |
| 6,077,642 A | 6/2000 | Ogata et al. |
| 6,080,643 A | 6/2000 | Noguchi et al. ............. 438/487 |
| 6,088,492 A | 7/2000 | Kaneko et al. |
| 6,093,944 A | 7/2000 | VanDover ................... 257/310 |
| 6,106,933 A | 8/2000 | Nagai et al. ................. 428/212 |
| 6,117,279 A | 9/2000 | Smolanoff et al. |
| 6,117,345 A * | 9/2000 | Liu et al. ....................... 216/19 |
| 6,133,670 A * | 10/2000 | Rodgers et al. .............. 310/309 |
| 6,146,225 A | 11/2000 | Sheats et al. .................. 445/24 |
| 6,154,582 A * | 11/2000 | Bazylenko et al. ............ 385/14 |
| 6,157,765 A | 12/2000 | Bruce et al. ................. 385/129 |
| 6,162,709 A | 12/2000 | Raux et al. .................. 438/513 |
| 6,165,566 A | 12/2000 | Tropsha |
| 6,176,986 B1 | 1/2001 | Watanabe et al. ...... 204/298.13 |
| 6,197,167 B1 | 3/2001 | Tanaka |
| 6,198,217 B1 | 3/2001 | Suzuki et al. |
| 6,204,111 B1 | 3/2001 | Uemoto et al. |
| 6,210,544 B1 | 4/2001 | Sasaki |
| 6,214,660 B1 | 4/2001 | Uemoto et al. |
| 6,232,242 B1 | 5/2001 | Hata et al. |
| 6,236,793 B1 | 5/2001 | Lawrence et al. |
| 6,242,129 B1 | 6/2001 | Johnson |
| 6,248,291 B1 | 6/2001 | Nakagama et al. ............ 419/46 |
| 6,248,640 B1 | 6/2001 | Nam |
| 6,261,917 B1 | 7/2001 | Quek et al. |
| 6,280,585 B1 | 8/2001 | Obinata et al. ......... 204/298.19 |
| 6,280,875 B1 | 8/2001 | Kwak et al. |
| 6,281,142 B1 | 8/2001 | Basceri et al. |
| 6,287,986 B1 | 9/2001 | Mihara ........................ 438/763 |
| 6,288,835 B1 | 9/2001 | Nilsson et al. |
| 6,290,822 B1 | 9/2001 | Fleming et al. ........ 204/192.22 |
| 6,300,215 B1 | 10/2001 | Shin |
| 6,302,939 B1 | 10/2001 | Rabin et al. .................... 75/338 |
| 6,344,419 B1 | 2/2002 | Forster et al. ............... 438/758 |
| 6,350,353 B2 | 2/2002 | Gopalraja et al. ......... 204/192.3 |
| 6,356,694 B1 * | 3/2002 | Weber ......................... 385/132 |
| 6,358,810 B1 | 3/2002 | Dornfest et al. ............. 438/396 |
| 6,361,662 B1 | 3/2002 | Chiba et al. |
| 6,365,319 B1 | 4/2002 | Heath et al. |
| 6,376,027 B1 | 4/2002 | Lee et al. |
| 6,409,965 B1 | 6/2002 | Nagate et al. .................. 419/26 |
| 6,413,382 B1 | 7/2002 | Wang et al. ............. 204/192.12 |
| 6,413,645 B1 | 7/2002 | Graff et al. |
| 6,416,598 B1 | 7/2002 | Sircar ......................... 148/688 |
| 6,423,776 B1 | 7/2002 | Akkapeddi et al. |
| 6,433,380 B2 | 8/2002 | Shin |
| 6,444,750 B1 | 9/2002 | Touhsaent |
| 6,452,717 B1 | 9/2002 | Endo |
| 6,488,822 B1 | 12/2002 | Moslehi ................... 204/192.12 |

| | | | |
|---|---|---|---|
| 6,506,289 B2 | 1/2003 | Demaray et al. | |
| 6,511,615 B1 * | 1/2003 | Dawes et al. | 264/1.21 |
| 6,533,907 B2 | 3/2003 | Demaray et al. | |
| 6,537,428 B1 | 3/2003 | Xiong et al. | 204/192.13 |
| 6,563,998 B1 * | 5/2003 | Farah et al. | 385/131 |
| 6,576,546 B2 | 6/2003 | Gilbert et al. | |
| 6,602,338 B2 | 8/2003 | Chen et al. | 252/301.4 |
| 6,605,228 B1 * | 8/2003 | Kawaguchi et al. | 216/24 |
| 6,615,614 B1 * | 9/2003 | Makikawa et al. | 65/386 |
| 6,632,563 B1 | 10/2003 | Krasnov et al. | |
| 6,683,244 B2 | 1/2004 | Fujimori et al. | |
| 6,683,749 B2 * | 1/2004 | Daby et al. | 360/125 |
| 6,750,156 B2 | 6/2004 | Le et al. | |
| 6,760,520 B1 | 7/2004 | Medin et al. | |
| 6,768,855 B1 * | 7/2004 | Bakke et al. | 385/129 |
| 6,827,826 B2 | 12/2004 | Demaray et al. | |
| 6,846,765 B2 | 1/2005 | Imamura et al. | |
| 6,884,327 B2 | 4/2005 | Pan et al. | |
| 2001/0027159 A1 | 10/2001 | Kaneyoshi | 501/152 |
| 2001/0031122 A1 | 10/2001 | Lackritz et al. | |
| 2001/0041460 A1 | 11/2001 | Wiggins | |
| 2002/0001746 A1 | 1/2002 | Jenson | |
| 2002/0033330 A1 | 3/2002 | Demaray et al. | |
| 2002/0076133 A1 | 6/2002 | Li et al. | |
| 2002/0106297 A1 | 8/2002 | Ueno et al. | 419/12 |
| 2002/0134671 A1 | 9/2002 | Demaray et al. | |
| 2002/0140103 A1 | 10/2002 | Kloster et al. | |
| 2002/0170821 A1 | 11/2002 | Sandlin et al. | |
| 2003/0019326 A1 | 1/2003 | Han et al. | 45/245 |
| 2003/0022487 A1 | 1/2003 | Yoon et al. | 438/642 |
| 2003/0042131 A1 | 3/2003 | Johnson | 204/192.12 |
| 2003/0044118 A1 | 3/2003 | Zhou et al. | |
| 2003/0063883 A1 | 4/2003 | Demaray et al. | 385/129 |
| 2003/0077914 A1 | 4/2003 | Le et al. | 438/763 |
| 2003/0079838 A1 | 5/2003 | Brcka | 156/345.48 |
| 2003/0097858 A1 | 5/2003 | Strohhofer et al. | |
| 2003/0127319 A1 | 7/2003 | Demaray et al. | |
| 2003/0134054 A1 | 7/2003 | Demaray et al. | |
| 2003/0141186 A1 | 7/2003 | Wang et al. | |
| 2003/0173207 A1 | 9/2003 | Zhang et al. | |
| 2003/0173208 A1 | 9/2003 | Pan et al. | |
| 2003/0174391 A1 | 9/2003 | Pan et al. | |
| 2003/0175142 A1 | 9/2003 | Milonopoulou et al. | 419/49 |
| 2003/0178637 A1 | 9/2003 | Chen et al. | |
| 2003/0185266 A1 | 10/2003 | Henrichs | |
| 2004/0077161 A1 | 4/2004 | Chen et al. | |
| 2004/0105644 A1 | 6/2004 | Dawes | |
| 2004/0259305 A1 | 12/2004 | Demaray et al. | |
| 2005/0000794 A1 | 1/2005 | Demaray et al. | |
| 2005/0006768 A1 | 1/2005 | Narasimhan et al. | |
| 2005/0183946 A1 | 8/2005 | Pan et al. | |
| 2006/0054496 A1 | 3/2006 | Zhang et al. | |
| 2006/0057283 A1 | 3/2006 | Zhang et al. | |
| 2006/0057304 A1 | 3/2006 | Zhang et al. | |
| 2006/0071592 A1 | 4/2006 | Narasimhan et al. | |

FOREIGN PATENT DOCUMENTS

| | | |
|---|---|---|
| EP | 0 652 308 A2 | 10/1994 |
| EP | 0 639 655 A1 | 2/1995 |
| EP | 0 820 088 A2 | 1/1998 |
| EP | 0 867 985 B1 | 9/1998 |
| EP | 0867 985 A1 | 9/1998 |
| EP | 1068899 A1 | 1/2001 |
| EP | 1 092 689 A1 | 4/2001 |
| EP | 1 189 080 A2 | 3/2002 |
| JP | 2-054764 A2 | 2/1990 |
| JP | 6-010127 A | 1/1994 |
| JP | 6-100333 A | 12/1994 |
| JP | 7-224379 A | 8/1995 |
| JP | 07-233469 A | 9/1995 |
| WO | WO 96/23085 A1 | 8/1996 |
| WO | WO 97/35044 A1 | 9/1997 |
| WO | WO 00/21898 | 4/2000 |
| WO | WO 00/21898 A1 | 4/2000 |
| WO | WO 00/22742 | 4/2000 |
| WO | WO 00/22742 A2 | 4/2000 |
| WO | WO 00/36665 A1 | 6/2000 |
| WO | WO 01/82297 A1 | 11/2001 |
| WO | WO 02/12932 A2 | 2/2002 |
| WO | WO 2004/021532 A1 | 3/2004 |
| WO | WO 2004/077519 A2 | 9/2004 |
| WO | WO 2004/106581 A2 | 12/2004 |
| WO | WO 2004/106582 A2 | 12/2004 |

OTHER PUBLICATIONS

Bestwick, T., "ASOC silicon integrated optics technology," Part of the SPIE Conferences on Photonics Packaging and Integration, SPIE vol. 3631, pp. 182-190 (Jan. 1999).

Choi et al., "Er-Al-codoped silicate planar light waveguide-type amplifier fabricated by radio-frequency sputtering," Optics Letters, vol. 25, No. 4, pp. 263-265 (Feb. 15, 2000).

Horst et al., "Compact, Tunable Optical Devices in Silicon-Oxynitride Wave Guide Technology," IBM Research Division, 3 pages (1999).

Kato et al., "Recent progress on PLC hybrid integration," Part of the SPIE Conference on Optoelectric Integrated Circuits III, *SPIE*. vol. 3631, pp. 28-36 (Jan. 1999).

Ladouceur, F. et al., "Effect of side wall roughness in buried channel waveguides," IEEE Proc., vol. 141, pp. 242-248 (Aug. 1994).

Laurent-Lund, C. et al., "PECVD Grown Multiple Core Planar Waveguides with Extremely Low Interface Reflections and Losses," IEEE Photonics Technology Letters vol. 10, No. 10, pp. 1431-1433 (Oct. 1998).

Roberts et al., "The Photoluminescence of Erbium-doped Silicon Monoxide," Department of Electronics and Computer Science, 7 pages (Jun. 1996).

Shmulovich et al., "Recent progress in Erbium-doped waveguide amplifiers," Bell Laboratories, 3 pages (1999).

Tervonen, A., "Challenges and opportunities for integrated optics in optical networks," Part of the SPIE Conference in Integrated Optics Devices IIII, SPIE vol. 3620, pp. 2-11 (Jan. 1999).

Ting et al., "Study of planarized sputter-deposited SiO2," *J. Vac. Sci. Technol.*, 15(3) pp. 1105-1112 (May/Jun. 1978).

Affinito et al., "Polymer-Oxide Transparent Barrier Layers," Society of Vacuum Coaters, 39th Annual Technical Conference Proceedings, May 5-10, 1996, Philadelphia, PA, pp. 392-397.

Almeida et al., "Nanotaper for compact mode conversion," *Optics Letters*, 28(15):1302-1304 (Aug. 2003).

Barbier et al, "Amplifying Four-Wavelength Combiner, Based on Erbium/Etterbium-Doped Waveguide Amplifiers and Integrated Splitters", *IEEE Photonics Technology Letters*, 9:3, pp. 315-317 (Mar. 1997).

Barbier, Denis, "Performances and potentioal applications of erbium doped planar waveguide amplifiers and lasers," GeeO, pp. 58-63 (1997).

Beach R.J., "Theory and optimization of lens ducts," *Applied Optics*, 35:12:2005-2015 (Apr. 1996).

Belkind et al., "Using pulsed direct current power for reactive sputtering of $Al_2O_3$," *J. Vac. Sci. Technol.* A 17(4), pp. 1934-1940 (Jul. 1999).

Chang, C.Y. (edited by), "ULSI Technology," The McGraw-Hill Companies, Inc., New York, 1996, Chapter 4, pp. 169-170, 226-231 (1996).

Delavaux et al., "Integrated optics erbium ytterbium amplifier system in 10 Gb/s fiber transmission experiment", 22nd European Conference on Optical Communication—ECOC' 96, Oslo, 4 pages, (1996).

Flytzanis et al, "nonlinear Optics in Composite Materials," E. Wolf, Progress in Optics XXIX (c) Elsevier Scince Publishers B.V., pp. 323-425 (1991).

Fujii et al, "1.54 mm photoluminescence of $Er^{3+}$doped into $SiO_2$ films containing Si nanocrystals: Evidence for energy transfer from Si nanocrystals for $Er^{3+}$", *Appl. Phys. Lett.* 71 (9), pp. 1198-1200 (Sep. 1997).

Garcia, C. "Size Dependence of Lifetime and Absorption Cross Section of Si Nanocrystals Embedded in $SiO_2$," *Appl. Phys. Lett.*, 82:10, pp. 1595-1597 (Mar. 10, 2003).

Han, Hak-Seung et al. "Optical Gain at 1.54 μm in Erbium-Doped Silicon Nanocluster Sensitized Waveguide," *Appl. Phys. Lett.*, 79:27, pp. 4568-4570 (Dec. 31, 2001).

Hayakawa et al, "Field enhancement effect of small Ag particles on the fluorescence from $Eu^{3+}$-doped $SiO_2$ glass", *Applied Physics Letters*, 74:11, pp. 1513-1515 (Mar. 15, 1999).

Hayakawa et al., "Enhanced fluorescence from $Eu^{3+}$ owing to surface plasma oscillation of silver particles in glass", Journal of Non-Crystalline Solids 259, pp. 16-22 (1999).

Hehlen et al. "Spectroscopic Properties of $Er^{3+}$- and $Yb^{3+}$-doped Soda-Lime Silicate and Aluminosilicate Glasses," Physical Review B, vol. 56, No. 15, Oct. 15, pp. 9302-9318 (1997).

Hehlen et al. "Uniform Upconversion in High-Concentration $Er^{3+}$-doped Soda Lime Silicate and Aluminosilicate Glasses," Optics Letters, vol. 22, No. 11, Jun. 1, pp. 772-774 (1997).

Hubner, J. and Guldberg-Kjaer, S., "Planar Er-and Yb-Doped Amplifiers and Lasers," COM Technical University of Denmark, 10.sup.th European Conf. On Integrated Optics, Session WeB2, Apr. 4-6, 2001, Paderborn, Germany, pp. 71-74 (Apr. 4, 2001).

Itoh, M. et al., "Large reduction of singlemode-fibre coupling loss in 1.5% delta planar lightwave circuits using spot-size converters," *Electronics Letters*, 38(2):72-74 (2002).

Jackson et al. "An Accurate Compact EDFA Model," Dept. of Electrical and Computer Engineering, University of BC (1999).

Kelly et al., "Control of the structure and properties of aluminum oxide coatings deposited by pulsed magnetron sputtering," *J. Vac. Sci. Technol.* A 17(3), pp. 945-953 (May 1999).

Kik, P.G. et al. "Gain Limiting Processes in Er-doped Si Nanocrystal Waveguides in $SiO_2$," *J. Appl. Phys.*, 91:1, pp. 534-536 (Jan. 1, 2002).

Lange et al, "High Gain Ultra-Short Length Phosphate glass Erbium-Doped Fiber Amplifier Material", OSA Optical Fiber Communications (OFC), 3 pages (2002).

Laporta et al, "Diode-pumped cw bulk Er: Yb: glass laser", *1952 Optics Letters*, 16:24, 6 pages (Dec. 15, 1991).

Lee et al, "Effect of size and roughness on light transmission in a S/$SiO_2$ waveguide: Experiments and model," *Appl. Phys. Lett.* vol. 77, No. 11 (Sep. 11, 2000).

Love, J.D. et al., "Quantifying Loss Minimisation in Single-Mode Fibre Tapers," *Electronics Letters*, 22(17):912-914 (1986).

Marques, P.V.S. et al., "Planar Silica-on-Silicon Waveguide Lasers Based in Two Layer Core Devices," 10.sup.th European Conference on Integrated Optics, Session WeB2, Apr. 4-6, 2001, Paderborn, Germany, pp. 79-82 (Apr. 4, 2001).

Meijerink et al, Luminescence of $AG^+$ in Crystalline and Glassy $SrB_4O_7$, *Journal of Physics and Chemistry of Solids*, vol. 54, No. 8, pp. 901-906 (1993).

Mesnaoui et al, "Spectroscopic properties of $AG^+$ ions in phospage glasses of $NaPO_3$—$AgPO_3$ system", *European Journal of Solid State and Inorganic Chemistry*, vol. 29, pp. 1001-1013 (1992).

Mitomu, O. et al., Design of a Single-Mode Tapered Waveguide for Low-Loss Chip-to-Fiber Coupling,: *IEEE Journal of Quantum Electronics*, 30(8):1787-1793 (1994).

Ohkubo et al., "Polarization-Insensitive Arrayed-Waveguide Grating Using Pure Si)2 Cladding," Fifth Optoelectronics and Communication Conference (OECC 2000) Technical Digest, 2 pages (Jul. 11, 2000).

Ohtsuki et al., "Gain Characteristics of a high concentration $Er^{3+}$-doped phosphate glass waveguide", *J. Appl. Phys.* 78(6), pp. 3617-3621 (1995).

Ono et al., "Design of a Low-loss Y-branch Optical Waveguide," Fifth Optoelectronic and Communications Conference (OECC 2000) Technical Digest, 2 pages (Jul. 11, 2000).

Rajarajan, M. et al., "Numerical Study of Spot-Zise Expanders for an Efficient OEIC to SMF Coupling," *IEEE Photonics Technology Letters*, 10(8):1082-1084 (1998).

Ramaswamy et al., "Ion-Exchanged Glass Waveguides: A Review", Journal of Lightwave Technology, vol. 6, No. 6, pp. 984-1001 (1988).

Schermer, R. et al., "Investigation of Mesa Dielectric Waveguides,", Proceedings of the OSA Integrated Photonics Research Topical Meeting and Exhibit, Paper No. IWB3 (Jun. 11, 2001).

Schiller et al. "PVD Coating of Plastic Webs and Sheets with High Rates on Large Areas," European Materials Research Society 1999 Spring Meeting, Jun. 1-4, 1999, Strasbourg, France, (Jun. 1999).

Second International Symposium of Polymer Surface Modification: Relevance to Adhesion, Preliminary Program (1999).

Sewell, P. et al., "Rib Waveguide Spot-Size Transformers: Modal Properties," *Journal of Lightwave Technology*, 17(5):848-856, (1999).

Shaw et al. "Use of Vapor Deposited Acrlate Coatings to Improve the Barrier Properties of MetallizedFilm," Society of Vacuum Coaters 505/856-7168, 37th Annual Technical Conference Proceedings, pp. 240-244 (1994).

Shin et al. "Dielectric and Electrical Properties of Sputter Grown $(Ba,Sr)TiO_3$ Thin Films," *J. Appl. Phys.*, vol. 86, No. 1, pp. 506-513 (Jul. 1999).

Slooff et al, "Optical properties of Erbium-doped organic polydentate cage complexes", J. Appl. Phys. 83, pp. 497-503 (Jan. 1998).

Smith, R.E., "Reduced Coupling Loss Using a Tapered-Rib Adiabatic-Following Fiber Coupler," *IEEE Photonics Technology Letters*, 8(8):1052-1054 (1996).

Van Dover, R.B. "Amorphous Lanthanide-Doped $TiO_x$ Dielectric Films," *Appl. Phys. Lett.*, vol. 74, No. 20, pp. 3041-3043 (May 17, 1999).

Viljanen et al, "Planar Optical Coupling Elements for Multimode Fibers with Two-Step Ion Migration Process", *Applied Physics*, 24:1, pp. 61-63 (Jan. 1981).

Villegas et al, "Optical spectroscopy of a soda lime glass exchanged with silver", *Physics and Chemistry of Glasses* 37(6), pp. 248-253, (1996).

Westlinder et al. "Simulation and Dielectric Characterization of Reactive dc Magnetron Cosputtered $(Ta_2O_5)_{1-x}(TiO_2)_x$ Thin Films," *J. Vac. Sci. Technol.* B, vol. 20, No. 3, pp. 855-861 (May/Jun. 2002).

Yanagawa, H. et al., "Index-and-Dimensional Taper and Its Application to Photonic Devices," *Journal of Lightwave Technology*, 10(5):587-591, (1992).

Electrometals Technologies Limited, Financial Report for the year 2002, Corporate Directory, Chairman's Review, Review of Operations (2003).

Affinito et al., "PML/oxide/PML Barrier Layer Performance Differences Arising from Use of UV or Electron Beam Polymerization of the PML Layers," *Thin Solid Films* vol. 308-309, pp. 19-25 (1997).

Barbier et al, "Amplifying Four-Wavelength Combiner, Based on Erbium/Etterbium-Doped Waveguide Amplifiers and Integrated Splitters", *IEEE Photonics Technology Letters*, vol. 9, pp. 315-317, 1997, 3.

Campbell et al., "Titanium dioxide ($TiO_2$)-based gate insulators," *IBM J. Res. Develop.* 43(3), 383-391, (May 1999).

Cooksey et al. "Predicting Permeability & Transmission Rate for Multilayer Materials," *Foodtechnology*, vol. 53, No. 9, pp. 60-63 (Sep. 1999).

Crowder, et al., "Low-Temperature Single-Crystal Si TFT's Fabricated on Si Films Processed via Sequential Lateral Solidification," IEEE, vol. 19, No. 8 (Aug. 1998), pp. 306-308.

Greene et al., "Morphological and electrical properties of rf sputtered Y203-doped Zr02 thin films," J. Vac. Sci. Tecnol., vol. 13, No. 1 (Jan./Feb. 1976), pp. 72-75.

Im, et al. "Controlled Super-lateral Growth of Si Films for Microstructural Manipulation and Optimization," Materials Science Program (1998), pp. 603-617.

Im, et al., "Crystalline Si Films for Integrated Active-Matrix LiquidCrystal Displays," MrS Bulletin (Mar. 1996), pp. 39-48.

Im, et al., "Single-crystal Si films for thin-film transistor devices," American Institute of Physics (1997), pp. 3434-3436.

Lamb, William et al. "Designing Non-Foil Containing Skins for Vacuum InsulationPanel (VIP) Applications," *Vuoto*, vol. XXVIII, No. 1-2—Gennaio-Giugno 1999, pp. 55-58 (1999).

Lee et al. "Effects of interfacial layer growth on the electrical characteristics of thin titanium oxide films on silicon," *Applied Physics Letters*, 74(21), 3143-3145, (May 1999).

Mardare et al. "On the structure of Titanium Oxide Thin Films," *Analele Stiintifice Ale Universitatii AI. l. Cuza IASI*, vol. XLV-XLVI, 201-208 (1999).

Tukamoto, H. et al., "Electronic Conductivity of $LiCoO_s$ and Its Enhancement by Magnesium Doping," J. Electrochem. Soc., vol. 44, No. 9, pp. 3164-3168 (Sep. 1997).
Wilkes, Kenneth T. "Gas Permeation Through Vacuum Barrier Films and its Effect on VIP Thermal Performance," Vacuum Insulation Panel Symp., Baltimore, Maryland, (May 3, 1999), Pages??.
Office Action issued on Sep. 27, 2004 in U.S. Appl. No. 10/291,179.
Response to Office Action filed on Mar. 14, 2005 in U.S. Appl. No. 10/291,179.
Office Action issued on Jun. 15, 2005 in U.S. Appl. No. 10/291,179.
Office Action issued on May 2, 2002 in U.S. Patent No. 6,533,907.
Response to Office Action filed on Sep. 3, 2002 in U.S. Patent No. 6,533,907.
Office Action issued on May 14, 2003 in U.S. Appl. No. 10/101,492.
Response to Office Action filed on Aug. 14, 2003 in U.S. Appl. No. 10/101,492.
Office Action issued on Sep. 3, 2003 in U.S. Appl. No. 10/101,492.
Response to Office Action filed on Mar. 3, 2004 in U.S. Appl. No. 10/101,492.
Office Action issued on Feb. 24, 2004 in U.S. Appl. No. 10/101,863.
Response to Office Action filed on Jul. 23, 2004 in U.S. Appl. No. 10/101,863.
Office Action issued on Oct. 6, 2004 in U.S. Appl. No. 10/101,863.
Office Action dated Jan. 13, 2005, received in U.S. Appl. No. 10/101,863.
Response to office Action filed on Jun. 10, 2005 in U.S. Appl. No. 10/101,863.
Office Action dated Mar. 25, 2005, received in U.S. Appl. No. 10/954,182.
Office Action issued on Oct. 22, 2003 in U.S. Appl. No. 10/101,341.
Response to Office Action filed on Feb. 23, 2004 in U.S. Appl. No. 10/101,341.
Office Action issued on Jun. 10, 2004 in U.S. Appl. No. 10/101,341.
Response to Office Action filed on Dec. 8, 2004 in U.S. Appl. No. 10/101,341.
Office Action issued on May 4, 2004 in U.S. Appl. No. 10/101,493.
International Search Report issued on Nov. 21, 2003 in PCT/US03/24809.
International Search Report issued on Oct. 11, 2004 in PCT/US2004/005531.
Written Opinion issued on Oct. 11, 2004 in PCT/US2004/005531.
Office Action issued Mar. 24, 2005 in U.S. Appl. No. 10/851,542.
Kim, H-K. and Yoon, Y., "Characteristics of rapid-thermal-annealed $LiCoO_2$ cathode film for an all-solid-state thin film microbattery," J. Vac. Sci. Technol. A 22(4):1182-1187 (2004).
Response to Office Action filed on Oct. 17, 2005 in U.S. Appl. No. 10/291,179.
Final Office Action issued on Dec. 14, 2005 in U.S. Appl. No. 10/291,179.
PCT Invitation to Pay Additional Fees for PCT/US01/22750, dated Mar. 13, 2002.
PCT International Search Report for PCT/US01/22750, dated Jul. 19, 2002.
PCT Written Opinion for PCT/US01/22750, dated Jul. 23, 2002.
PCT International Preliminary Examination Report for PCT/US01/22750, dated Oct. 8, 2002.
Office Action issued Sep. 21, 2005 in U.S. Appl. No. 11/100,856.
Response to Office Action filed Dec. 5, 2005, in U.S. Appl. No. 10/101,863.
Final Office Action issued on Feb. 14, 2006, in U.S. Appl. No. 10/101,863.
Response to Office Action filed Feb. 24, 2006, in U.S. Appl. No. 10/101,863.
Response to Office Action filed on Jul. 25, 2005 in U.S. Appl. No. 10/954,182.
Office Action issued on Oct. 25, 2005, in U.S. Appl. No. 10/954,182.
Response to Office Action filed on Dec. 21, 2005 in U.S. Appl. No. 10/954,182.
Response to Office Action filed on Nov. 8, 2005, in U.S. Appl. No. 10/101,341.
Office Action issued on Feb. 13, 2006, in U.S. Appl. No. 10/101,341.
Office Action issued on Oct. 3, 2005 in U.S. Appl. No. 10/650,461.
Response to Office Action filed on Jan. 3, 2006 in U.S. Appl. No. 10/650,461.
International Preliminary Examination Report mailed Apr. 15, 2004 in PCT/US03/24809.
Office Action issued on Dec. 2, 2005 in U.S. Appl. No. 10/789,953.
Specification and Preliminary Amendment as filed for U.S. Appl. No. 11/297,057.
Office Action issued on Mar. 24, 2005 in U.S. Appl. No. 10/851,542.
Response to Office Action dated Jul. 25, 2005 in U.S. Appl. No. 10/851,542.
Office Action issued on Oct. 19, 2005 in U.S. Appl. No. 10/851,542.
Response to Office Action filed Jan. 19, 2006 in U.S. Appl. No. 10/851,542.
PCT International Search Report and Written Opinion for Application No. PCT/US2004/014524 dated Mar. 2, 2005.
PCT International Preliminary Report on Patentability for Application No. PCT/US2004/014524, dated Dec. 8, 2005.
PCT International Search Report for Application No. PCT/US2004/014523 dated Jan. 17, 2005.
PCT Written Opinion for Application No. PCT/US2004/014523 dated Jan. 17, 2005.
PCT International Preliminary Report on Patentability for Application No. PCT/US2004/014523, dated Dec. 8, 2005.
Specification as filed for U.S. Appl. No. 11/297,057.
Goossens, A. et al., "Sensitization of $TiO_2$ with p-type semiconductor polymers," Chem. Phys. Lett. 287:148 (1998).
Ladouceur, F. and Love, J.D., in: Silica-based Buried Channel Waveguides and Devices, Chapman & Hall, London, pp. 98-99 (1996).
Von Rottkay, K. et al., "Influence of stoichiometry on electrochromic cerium-titanium oxide compounds," Presented at the 11th Int'l. Conference of Solid State Ionics, Honolulu, Hawaii, Nov. 19, 1997, Published in Solid State Ionics 113-115:425-430. (1998).
Dorey, R.A., "Low temperature micromoulding of functional ceramic devices," Grant summary for GR/S84156/01 for the UK Engineering and Physical Sciences Research Council, 2 pages (2004).
Howson, R.P., "The reactive sputtering of oxides and nitrides," Pure & Appl. Chem. 66(6):1311-1318 (1994).
Office Action issued on Aug. 4, 2005, in U.S. Appl. No. 10/101,863.
Office Action issued on Aug. 8, 2005 in U.S. Appl. No. 10/101,341.
Cocorullo, G. et al., "Amorphous silicon waveguides and light modulators for integrated photonics realized by low-temperature plasma-enhanced chemical-vapor deposition," Optics Lett. 21(24):2002-2004 (1996).
Masuda, H. & Kawai, S., "Wide-band and gain-flattened hybrid fiber amplifier consisting of an EDFA and a multiwavelength pumped raman amplifier," IEEE Photonics Technology Lett. 11(6):647-649 (1999).
Snoeks, E. et al., "Cooperative upconversion in erbium-implanted soda-lime silicate glass optical waveguides," J. Opt. Soc. Am. B 12(8):1468-1474 (1995).
Notice of Allowance mailed Aug. 6, 2002, for US Patent No. 6,506,289.
Notice of Allowance mailed Mar. 25, 2004 for US Patent No. 6,827,826.
Notice of Allowance issued on Oct. 8, 2002, in U.S. Patent No. 6,533,907.
Notice of Allowance issued on Oct. 21, 2004, in U.S. Appl. No. 10/101,492.
Response to Office Action filed Feb. 17, 2006 in U.S. Appl. No. 11/100,856.
Final Office Action mailed Jun. 9, 2006 in U.S. Appl. No. 11/100,856.
Response to Office Action filed Sep. 11, 2006 in U.S. Appl. No. 11/100,856.
Response to Office Action filed Jun. 12, 2006 in U.S. Appl. No. 10/101,863.
Office Action mailed Sep. 6, 2006, in U.S. Appl. No. 10/101,863.
Office Action issued on Mar. 23, 2006, in U.S. Appl. No. 10/650,461.
Response to Office Action filed on Jul. 24, 2006, in U.S. Appl. No. 10/650,461.
Office Action dated Sep. 22, 2006 from Korean Patent Office in Appl. No. 10-2005-7016055.

Office Action issued Nov. 28, 2001, for US Patent No. 6,506,289.

Response to Office Action filed Feb. 20, 2002, for US Patent No. 6,506,289.

Office Action issued Apr. 17, 2002, for US Patent No. 6,506,289.

Response to Office Action filed Jul. 17, 2002, for US Patent No. 6,506,289.

Ex parte Quayle Action mailed Nov. 10,, 2003 for US Patent No. 6,827,826.

Final Office Action mailed Oct. 19, 2006, in U.S. Appl. No. 10/650,461.

Voluntary Amendment filed Jul. 26, 2006 in TW Appl. No. 92123625.

Office Action mailed Apr. 19, 2006 in U.S. Appl. No. 10/851,542.

Office Action dated Jan. 25, 2008, in U.S. Appl. No. 11/100,856.

Response to Office Action filed Feb. 25, 2008, in U.S. Appl. No. 11/100,856.

Notice of Allowance dated Jan. 25, 2008, in U.S. Appl. No. 10/101,863.

Notice of Allowance dated Feb. 1, 2008, in U.S. Appl. No. 10/954,182.

Preliminary Amendment dated Mar. 11, 2008, in U.S. Appl. No. 11/228,717.

Notice of Allowance dated Apr. 2, 2008, in U.S. Appl. No. 11/228,717.

Response to Office Action filed Apr. 16, 2008, in U.S. Appl. No. 10/650,461.

Final Office Action issued on May 19, 2006 in U.S. Appl. No. 10/789,953.

* cited by examiner

AS-DEPOSITED PLANAR OPTICAL WAVEGUIDES WITH LOW SCATTERING LOSS AND METHODS FOR THEIR MANUFACTURE

FIELD OF THE INVENTION

This invention relates generally to planar optical waveguides and methods for their manufacture, and, in particular, to waveguide designs and manufacturing processes that minimize scattering loss due to sidewall roughness.

BACKGROUND

The increasing prevalence of fiber optic communications systems has created an unprecedented demand for devices for processing optical signals. Planar devices such as optical waveguides, couplers, splitters, and amplifiers, fabricated on planar substrates, like those commonly used for integrated circuits, and configured to receive and process signals from optical fibers are highly desirable. Such devices hold promise for integrated optical and electronic signal processing on a single semiconductor-like substrate.

The basic design of planar optical waveguides and amplifiers is well known, as described, for example in U.S. Pat. Nos. 5,119,460 and 5,563,979 to Bruce et al. U.S. Pat. No. 5,613,995 to Bhandarkar et al., U.S. Pat. No. 5,900,057 to Buchal et al., and U.S. Pat. No. 5,107,538 to Benton et al., to cite only a few. The devices consist, very generally, of a core region, typically bar shaped, of a certain refractive index surrounded by a cladding region of a lower refractive index. In the case of an optical amplifier, the core region contains a certain concentration of a dopant, typically a rare earth ion such as an erbium or praseodymium ion which, when pumped by a laser, fluoresces, for example, in the 1550 nm and 1300 nm wavelength range, respectively, used for optical communication, amplifying the optical signal passing through the core.

As described, for example, in the patents to Bruce et al., to Bhandarkar et al., and to Buchal et al., planar optical devices may be fabricated by process sequences including forming a layer of cladding material on a substrate, forming a layer of core material on the layer of cladding material, patterning the core layer using a photolithographic mask and an etching process to form a core ridge, and covering the core ridge with an upper cladding layer.

To be useful in optical communications systems, devices need to have low loss levels; that is, the intensity and optical quality of optical signals should not be inadvertently degraded by the planar optical devices. Typical systems requirements specify devices with passive insertion losses of less than about 0.2 dB/cm. Induced scattering loss due to surface roughness of the sidewalls of the core region has been identified as a significant loss mechanism in planar optical devices. For example, Foresi et al., in U.S. Pat. No. 5,841,931, report that surface roughness is a dominant source of loss in waveguides having polycrystalline silicon cores and silicon dioxide cladding layers. The relationship between scattering loss and waveguide surface roughness is also treated in publications by Lee et al. (*Appl. Phys. Lett.* 77, 1617 (2000)) and Ladouceur et al. (*IEE Proc. Optoelectron.* 141, 242 (1994).)

The etching process used to form the core ridge is understood to be a major source of surface roughness of the core sidewalls of planar waveguides and amplifiers. The paper of Ladouceur et al., for example, demonstrates that for a silica based waveguide, the surface roughness of the etched core is intimately linked with the surface roughness of the mask used in the etching process. Rare earth doped materials, used as core materials in amplifiers, are even harder to etch than undoped materials, adding to the surface roughness problem in optical amplifiers. In particular, alumina and other refractory ceramics, which are hosts for rare earth dopants, take on a precrystalline or segregated condition upon heat treatment for dopant activation. Such a precrystalline condition further aggravates sidewall roughness on etching.

Thus it would be desirable to provide waveguide and amplifier designs and fabrication methods that minimize sidewall roughness, enabling the construction of improved devices with reduced scattering losses.

SUMMARY

An as-deposited waveguide structure is formed by a vapor deposition process without etching of core material. According to an aspect of the present invention, a planar optical device of a lighthouse design includes a ridge-structured lower cladding layer of a low refractive index material. The ridge-structured lower cladding layer has a planar horizontal surface portion and a ridge portion, the ridge portion extending a height H above the planar horizontal surface portion. The lower cladding layer may optionally overlie a planar substrate such as a silicon wafer.

A core layer of a core material having a higher refractive index than the low refractive index material of the lower cladding layer overlies the top of the ridge portion of the lower cladding. The core layer has a thickness T. A slab layer of the core material having a predominant thickness T overlies the planar portion of the lower cladding layer. When the height of the ridge H is greater than the thickness T of the core layer, or, for additional separation, greater than one and a half times the thickness T, coupling of light from the core layer to the slab layer is advantageously minimized.

The lighthouse waveguide also includes a top cladding layer of a material having a lower refractive index than the core material, overlying the core layer and the slab layer. To form an optical amplifier, the core material contains a concentration of photoluminescent dopants such as rare earth and/or transition metal ions. The present planar optical devices may include multiple waveguiding structures on a single substrate, for receiving, for example, demultiplexed signals from a wavelength division multiplexed fiber.

A method of forming an as-deposited waveguide structure includes first forming a ridge structure in a layer of low refractive index material to provide a lower cladding layer. Next a layer of core material is deposited over the ridge structure by a vapor deposition process. Finally, a top cladding layer of a material having a lower refractive index than the core material is deposited over the core layer. In this way, by first forming the ridge structure in the lower cladding layer, a waveguide is formed without etching of core material.

The core material is advantageously deposited on the ridge structured lower cladding by a physical vapor deposition process in which radiofrequency sputtering of a wide area target is performed under conditions of uniform sputter target erosion. When radiofrequency power is applied to the ridge structured lower cladding during core layer deposition, in a substrate bias process, core material with exceptionally low average surface roughness is produced. Furthermore, for lighthouse waveguides in which the ridge height H is greater than twice the core material thickness T, when the substrate bias process is used for core deposition, the core layer atop the ridge portion is separated from the slab layer atop the planar portion of the lower cladding layer, reducing undesired coupling of guided intensity from the core layer to the slab layer.

Alternatively, core material can be deposited on the ridge structured lower cladding by a reactive direct current physical vapor deposition process in which pulsed direct current power is applied to a target in the presence of a reactive gas. Chemical reaction between the target material and the reactive gas results in deposition of core material on the ridge structured lower cladding.

By combining the present lighthouse waveguide design and fabrication method that does not require etching of core material with a physical vapor deposition process including substrate bias that provides dense, smooth, columnar-free core material, problems due to sidewall roughness in previous waveguide designs are reduced or eliminated.

DETAILED DESCRIPTION

An as-deposited waveguide structure is formed without etching of core material. The as-deposited structure provides planar optical waveguides and amplifiers with reduced scattering loss due to core sidewall roughness. The waveguide is formed by depositing a layer of core material over a preformed ridge structure in a bottom cladding layer. A layer of cladding material is deposited over the layer of core material to form the top cladding layer.

Figure 1A:
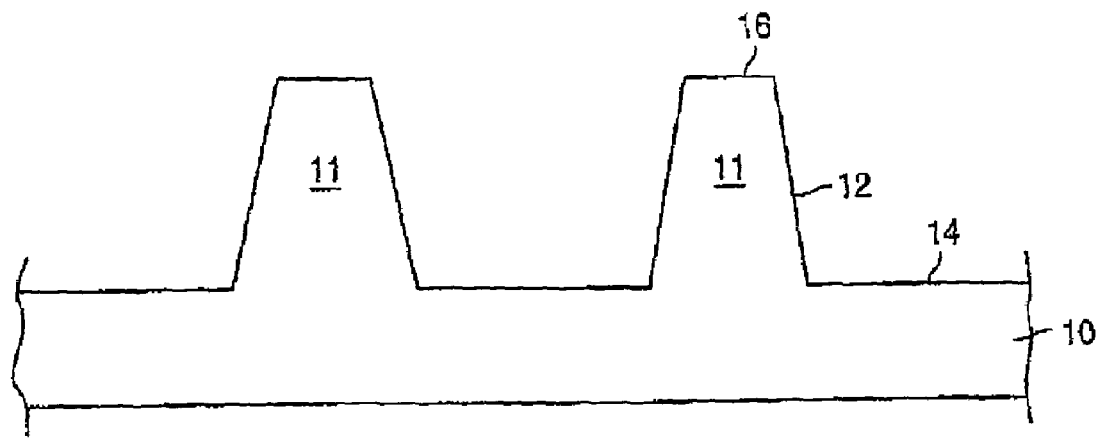
FIGS. 1A-1C are schematic cross sections illustrating a process of forming an as-deposited planar waveguide according to embodiments of the present invention.
Figure 1B:
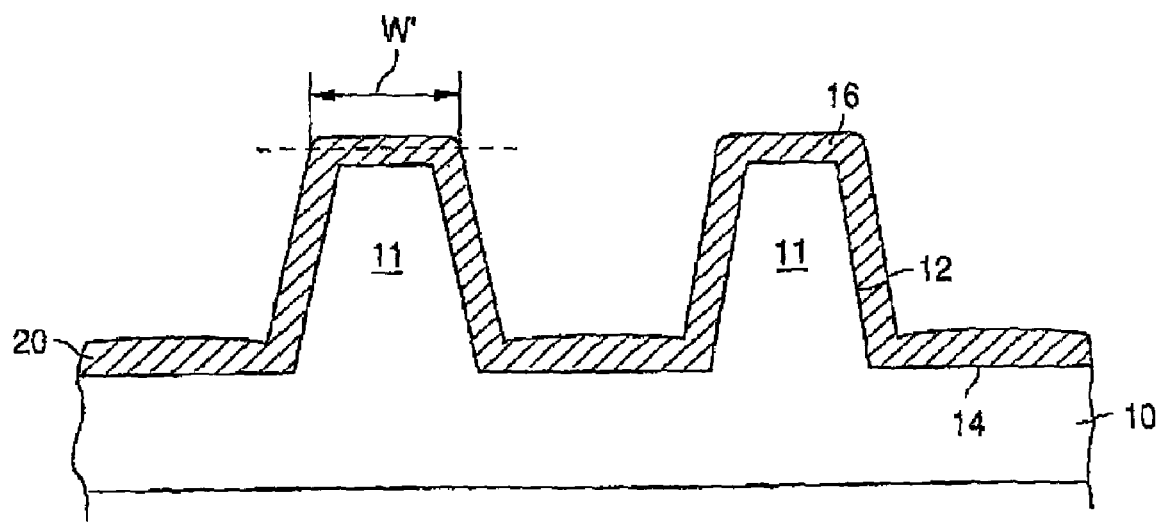
Figure 1C:
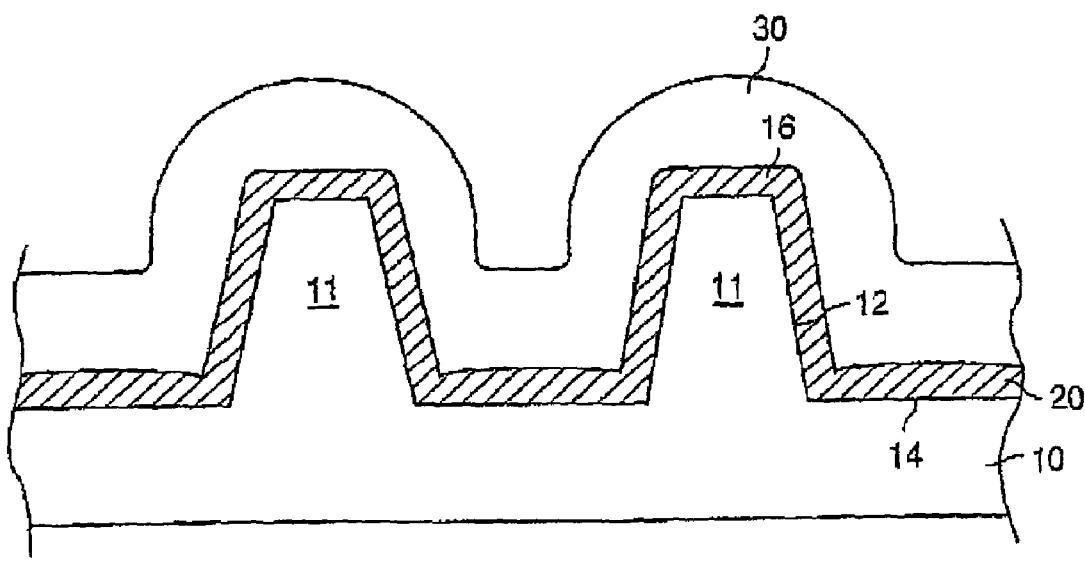
Figure 2:
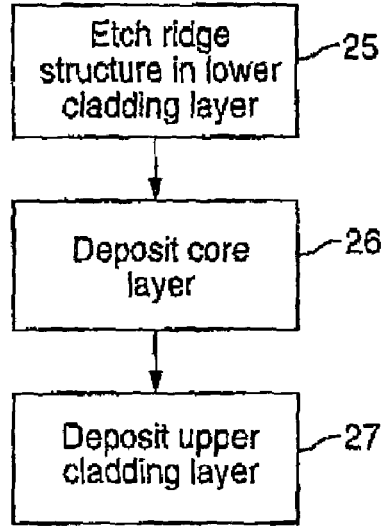
FIG. 2 is a flowchart of the process illustrated in FIGS. 1A-1C.

A generic process sequence to form a planar waveguide, according to embodiments of the present invention, is illustrated in the cross sections of FIGS. 1A-1C and the flowchart of FIG. 2. Layer 10 is a layer of a low refractive index material suitable to serve as the lower cladding layer of an optical waveguide or amplifier. Layer 10 may optionally overlie a planar substrate (not shown), such as a silicon wafer. First, at step 25, ridge structures 11, are etched into lower cladding layer 10, for example, using conventional photolithography as shown in FIG. 1A. Next, at step 26, a layer of core material 20, having a higher refractive index than lower cladding layer 10, is deposited over the ridge structured lower cladding layer 10 comprising ridge structures 11. Core layer 20 covers the top surface 16 of ridge structure 11, the sidewall 12 of structure 11 and the horizontal surfaces 14 between structures 11; as in FIG. 1B. As clearly illustrated in FIG. 1B, core layer 20 completely and continuously covers an entire surface of top surface 16, an entire surface of sidewall 12, and an entire surface of each of the horizontal surfaces 14. In the last step 27, an upper cladding layer 30 is deposited over the layer of core material 20, to produce the structure of FIG. 1C.

As described below, light of a given frequency may be guided when the thicknesses of the layers 20 and 30, width and height of the structures 11, and difference in refractive index of the core and cladding materials are suitably chosen. In this way, the present process allows a waveguiding structure to be fabricated without any requirement to etch the core material. The direction of light propagation through the structure of FIG. 1C is perpendicular to the illustrated cross section. For illustrative purposes, the cross sections of FIGS. 1A-1C show two exemplary structures 11. The present process may be used to form a single waveguiding structure or to form multiple waveguiding structures on a single substrate, designed, for example, for receiving demultiplexed signals from a wavelength division multiplexed (WDM) fiber.

Optical materials useful as lower cladding layer 10 and upper cladding layer 30 include various forms of silica (silicon dioxide), such as quartz, amorphous silica, or fused silica; alumina; and combinations of silica and alumina. In addition, other amorphous materials, particularly amorphous materials that meet the criteria of low coefficient of thermal expansion and high transparency may be used. Thus, transparent oxides, transparent dielectrics, and transparent semiconductors may serve as cladding layers. While amorphous materials are frequently used as optical materials, polycrystalline forms and even single crystal materials are potentially useful. A silicon dioxide layer formed on a silicon wafer by a thermal oxidation process, informally termed thermal oxide, may also serve as lower cladding layer 10. While lower cladding layer 10 and upper cladding layer 30 typically have similar refractive indices, it is not necessary for the upper and lower cladding layers in a given device to be made of precisely the same material.

For a waveguiding structure, core layer 20 may be formed of the same class of materials as the cladding layers, where the refractive index of the core layer material is controlled to have a higher value of refractive index than the refractive index of the cladding layer. For amplifiers, the core material typically includes, in addition, photoluminescent species, such as the lanthanides erbium (Er), ytterbium (Yb), thulium (Tm), praseodymium (Pr), neodymium (Nd), and dyprosium (Dy), which are present in the core material in the form of ions. Concentrations of rare earth species between about 100 parts per million (ppm) and 1% are generally used in the core materials of optical amplifiers. Small concentrations of additional transition metal or other ions may also be present. In planar amplifiers, it is often useful for the same material to serve as the cladding layers and as the host for the rare earth species in the core layer. Alumina is an advantageous host for rare earth ions. A combination of alumina and silica may also serve as the host material for the doped core layer of optical amplifiers. In another example, for strongly guiding waveguides, corresponding to a large difference in refractive index, $\Delta n$, between the core and cladding layers, polycrystalline silicon may serve as the core material, while silicon dioxide serves as the cladding layers. In addition, core or cladding materials may be composed in part by organic or silaceous polymers.

Vapor phase processes are used to deposit core layer 20 and upper cladding layer 30. Useful vapor phase deposition processes include chemical vapor deposition (CVD), physical vapor deposition (PVD), which is alternatively termed sputtering, electron beam evaporation, and laser ablation. Solvent based polymers may be applied, for example, by aerosol spin-coating or spraying techniques.

Figure 3:
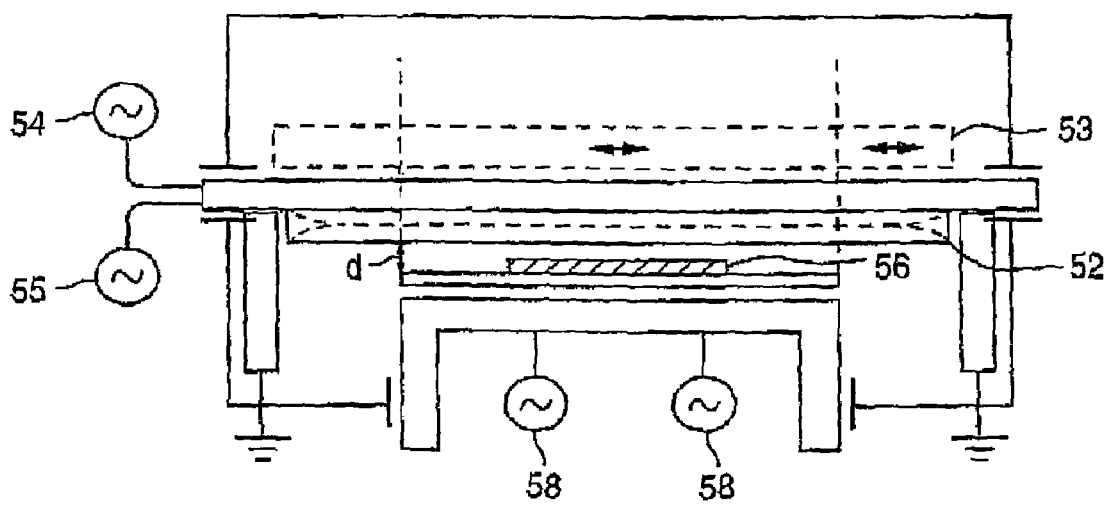
FIG. 3 is a schematic diagram of a reactor useful for wide area target RF sputtering deposition of optical materials as part of the fabrication process according to embodiments of the present invention.

One advantageous PVD method of depositing core layer 20 or upper cladding layer 30 uses radio frequency (RF) sputtering with a wide area target. An apparatus for RF sputtering with a wide area target is shown in FIG. 3. The method and apparatus are described in commonly assigned U.S. application Ser. No. 09/633,307, (the '307 application, now abandoned) and U.S. Pat. No. 6,506,289, which is a continuation-in-part and claims priority to the '307 application. Both the '307 application and the '289 patent are herein incorporated by reference in their entirety. For deposition of core layer 20, the ridge structured lower cladding layer, as in FIG. 1A, is positioned opposite a wide area sputter source target 52. The ridge structured lower cladding layer is depicted as substrate 56 in FIG. 3. (For deposition of upper cladding layer 30, the structure of FIG. 1B, including core layer 20, is positioned as substrate 56.)

Source target 52 is a chemically uniform, planar target composed of the material to be deposited. Material is sputtered from source target 52 onto substrate 56 by applying RF power, from RF generator 54 to target 52, generating a plasma in a background gas. RF generator 54 is a high frequency source, conventionally operated at 13.56 MHz. An inert gas, typically argon, is used as the background sputtering gas. As described in the '307 application, the conditions for deposition of high quality optical materials are that the target 52 is larger in area than the substrate 56 and that a central portion of the target overlying the substrate is exposed to a uniform plasma condition, which provides a condition of uniform target erosion.

A uniform condition of sputter erosion can be created by sputtering without magnetic enhancement, termed diode sputtering, or by creating a large uniform magnetic field using a scanning magnet magnetron source 53 in FIG. 3. Uniform target erosion is evidenced by the persistence of film uniformity throughout an extended target life. A uniform deposited film is defined as a film having a nonuniformity in thickness, when measured at representative points on the entire surface of a substrate wafer, of less than about 5%. Thickness non-uniformity is defined by convention as the difference between the minimum and maximum thickness divided by twice the average thickness. If films deposited from a target from which more than about 20% of the weight of the target has been removed continue to exhibit thickness uniformity, then the sputtering process is judged to be in a condition of uniform target erosion for all films deposited during the target life.

In depositing core layer 20, a dual frequency RF sputtering process, in which low frequency RF power is also applied to target 52, can be beneficial. Low frequency generator 55 provides power in the frequency range from about 100 to 400 kHz. Low frequency RF power is understood to accelerate ions in the plasma more efficiently than high frequency RF power. The accelerated ions bombard the film as it is being deposited on the substrate, resulting in sputtering and densification of the film. The dual frequency RF sputtering process is further described in the '307 application. As demonstrated in Example 1 below, the average surface roughness of as-deposited RF sputtered silica films is, for all process conditions investigated, less than about 4.5 nm. In contrast, about the smallest surface roughness that can be achieved by conventional etching of un-annealed vapor deposited silica is at least an order of magnitude larger. The large contrast between the smoothness of as-deposited films and etched films clearly demonstrates the benefits of the present process of forming waveguides without etching of the core material.

In addition, the dual frequency RF deposition process generally results in films with a reduced surface roughness as compared with single frequency deposition. For silica, films with average surface roughness in the range of between about 1.5 and 2.6 nm have been obtained with the dual frequency RF process.

Further, the dual frequency RF process can be used to tune the refractive index of the deposited film. Keeping the total RF power the same, the refractive index of the deposited film tends to increase with the ratio of low frequency to high frequency RF power. For example, core layer 20 of a planar waveguide can be deposited by a dual frequency RF process, and the same target 52, can be used to deposit upper cladding layer 30 using a single frequency RF process. Introducing low frequency RF power in the core layer deposition process can therefore be used to provide the difference in refractive index between the core and cladding layer materials.

It is particularly beneficial to further augment the single frequency or dual frequency RF sputtering process by introducing so-called substrate bias, that is by applying RF power to the substrate 56, using, for example, substrate RF generator 58. Sputtering with substrate bias is also discussed in the '307 application. When power is applied to the substrate, a plasma sheath is formed about the substrate and ions are coupled from the plasma. The sheath potential serves to accelerate ions from the plasma so that they bombard the film as it is being deposited, sputtering the film, and forward scattering surface atoms. The effects of introducing substrate bias are akin to, but more dramatic than, the effects of adding the low frequency RF component to the sputter source. Bias sputtering results in material that is dense, smooth, and columnar-free and thus is very well suited for use in optical devices.

Figure 4A:
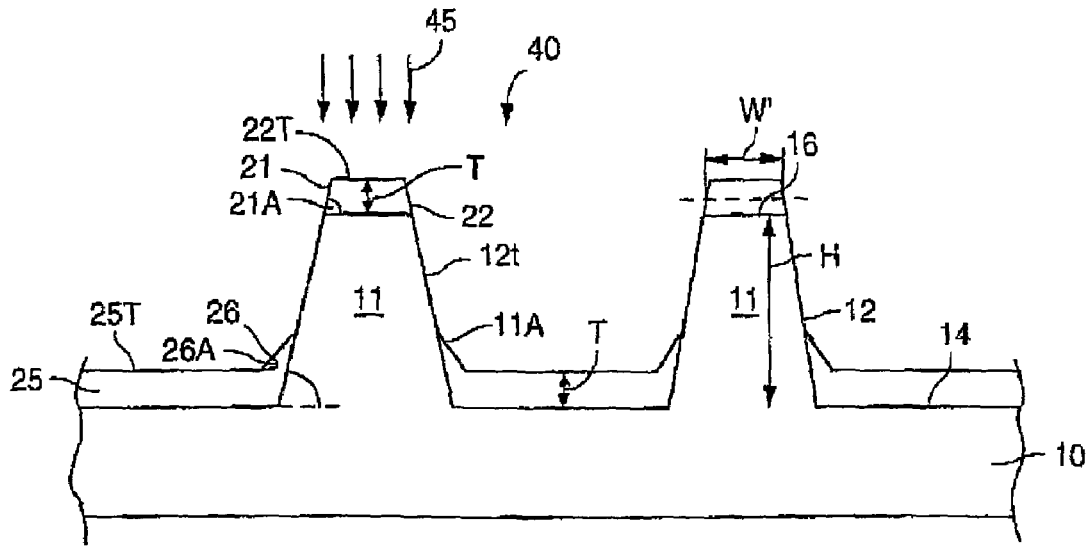
FIGS. 4A and 4B are schematic cross sections corresponding approximately to FIG. 1B in which the core layer is deposited by a process including applying RF power to the substrate.
Figure 4B:
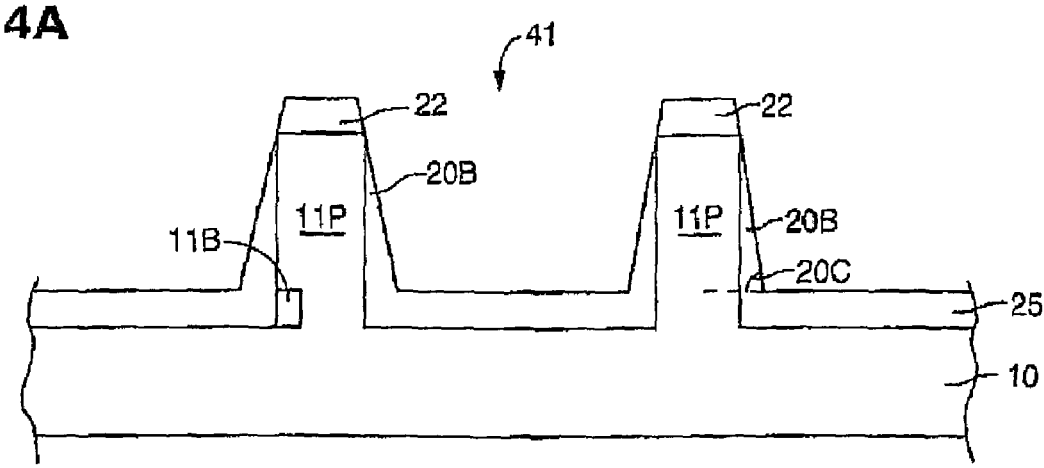

Using the bias sputtering process, the film is simultaneously deposited and etched. FIGS. 4A and 4B illustrates a core layer deposited using substrate bias. The net accumulation of film at any point on a surface depends on the relative rates of deposition and etching, which depend, respectively, on the power applied to the target and to the substrate, and on the angle that the surface makes with the horizontal. The rate of etching is greatest for intermediate angles, on the order of 45 degrees, that is between about 30 and 60 degrees.

The target and substrate powers can be adjusted such that the rates of deposition and etching are approximately the same for a range of intermediate angles. In this case, films deposited with bias sputtering have the following characteristics. At a step where a horizontal surface meets a vertical surface, the deposited film makes an intermediate angle with the horizontal. On a surface at an intermediate angle, such as the angle 11A, of the ridge sidewall, in FIG. 4A, there will be no net deposition since the deposition rate and etch rate are approximately equal. There is net deposition on a vertical surface.

For sidewall angle 11A, in an intermediate range of angles, a structure such as structure 40 in FIG. 4A is obtained. Structure 40 includes two regions of core material: core layer 22 atop ridge structure 11, and slab layer 25 between the ridge structures. The thickness T of core layer 22 and of slab layer 25 is similar. Note that the thickness T of the slab layer refers to the thickness over the predominant region of the slab excluding the edge portion 26. Core layer 22 has sides 21 which make an angle 21A with the horizontal. The edge 26 of slab layer 25 makes an angle 26A with the horizontal. Both angles 21A and 26A are in the intermediate range around 45 degrees, characteristic of bias sputtering. For a height H of ridge structure 11 that is sufficiently larger than the thickness T, there is a region 12t of the sidewall 12 of ridge structure 11 on which no core material is deposited. That is, core layer 22 is separated from slab layer 25. When ridge height H is greater than about two times the core thickness T, there is some separation between slab layer 25 and core layer 22.

For ridge structure 11P having approximately vertical sidewalls making an angle 11B on the order of 90 degrees with the horizontal, a structure such as structure 41 of FIG. 4B is obtained by bias sputtering. Structure 41 includes sidewall layer 20B, the outer surface of which makes the characteristic intermediate angle 20C with the horizontal. Unlike structure 40, ridge structure 11P, including a top surface, sidewalls, and horizontal surfaces between adjacent ridge structures 11P, is continuously covered with core material forming a continuous core material formed on structure 11P, the continuous core material including core layer 22 formed on the top surface, sidewall layer 20B formed on the sidewalls, and slab portion 25 formed on the horizontal surfaces. Structure 41, most frequently additionally covered with a top cladding layer, provides an alternative waveguiding structure.

A bias sputtering process without magnetic enhancement has been observed to provide deposited films with exceptionally low surface roughness and exceptional refractive index uniformity. As described in Example 2 below, using substrate bias in a diode sputtering process, a silica film with an average surface roughness of 0.14 nm and a refractive index uniformity of less than $4 \times 10^{-5}$% has been obtained. Further, as demonstrated in FIG. 5, diode bias sputtering produces structures with the characteristic angle of the external surface of the ridge-covering layer depicted schematically in FIG. 4. Diode bias sputtering therefore, offers particular advantages for forming the core layer of an as-deposited waveguide structure. While in certain previous applications, diode sputtering has been ruled out as a practical process due to a deposition rate that is much slower than the rate of magnetron sputtering, for fabricating waveguide structures, a uniform, wide area batch process in which multiple structures are produced simultaneously can overcome the disadvantages of a slow deposition rate.

Using a suitably arranged mixed sputter target, it is possible to form core layer 22 and sidewall layer 20B of FIG. 4B of different material during a single deposition. The mixed sputter target may be used with any of the sputter deposition processes described here. The mixed sputter target has a central portion composed of, for example, a higher index material and/or a doped material, and an outer portion composed of a lower index and/or an undoped material. For the rectangular target, as described in the '307 application, the central portion can form a "stripe" running across the entire target.

The material comprising the core layer 22 of FIGS. 4A and 4B will be a line of sight mixture of the two portions of the target. The mixture will be determined by the ratio of area of the two regions and the relative sputter rates of the two regions, together with the subtended solid angles of the two regions, which are further weighted by the square of the inverse of the distance. By placing the ridge structured lower cladding layer under the central portion of the target for sputter deposition, the material deposited on core layer 22 favors the material of the central region of the target. Material deposited on slab layer 25 between the ridges would similarly be enriched in central region material.

At the same time, the material deposited on sidewall region 20B favors the material of the outer portion of the sputter target. If the material of the outer portion of the target is composed of the same or similar material as that of regions 11 or 11P, the refractive index of the coating of the sidewall will be similar to that of the lower cladding 11 or 11P. In the case of FIG. 4B, it can be seen that, using the mixed sputter target, a gradient in the index from the core layer 22 to the sidewall layer 20B can be obtained. A structure with such a gradient can be thought of as the planar equivalent of a graded biconic fiber. A region of smooth gradient in refractive index, at the interface between core layer 22 and sidewall layer 20B, is beneficial in further reducing scattering from the non-etched core.

Another advantageous PVD method of depositing core layer 20 or upper cladding layer 30 uses reactive pulsed direct current (DC) magnetron sputtering with a wide area target. An apparatus used for DC sputtering may be similar to that illustrated in FIG. 3 except for reference 54, which, in the DC case, is a pulsed DC power supply instead of an RF generator. In reactive DC sputtering, the deposited material is the result of a reaction between species sputtered from the target 52 and a reactive gas provided in the sputtering chamber. For example, reactive DC sputtering can be used to provide an upper cladding layer 30 composed of alumina, $Al_2O_3$, by sputtering an aluminum target under conditions where oxygen has been added to an inert background gas.

A core layer 20, in which alumina serves as the host for a small percentage of rare earth elements can be prepared by reactive DC sputtering of an alloy target composed of aluminum and the rare earth and other elements. Similarly, a mixture of silica and alumina, which is a beneficial host for rare earth doped core layer 20, can be prepared by reactive DC sputtering of an alloy target composed of silicon, aluminum, and the rare earth and/or other dopants. The alloy targets can be fabricated by conventional powdered metallurgical techniques. A method of pulsed DC sputtering with a wide area target is described in commonly assigned U.S. Pat. No. 6,533,907 (the '907 patent), which is incorporated herein by reference in its entirety. Example 3 demonstrates deposition of alumina by reactive pulsed DC sputtering using a pulsed DC power supply with a controllable pulse profile in place of the switching power supply of the '907 patent.

In yet another advantageous deposition process for a doped core layer 20 of an optical amplifier, any of the vapor phase deposition processes described above is used to form a layer of host material for the core layer, followed by ion implantation of the dopant species. By providing an ion beam 45 in FIG. 4A directed perpendicular to the horizontal plane of lower layer 10, only the top portion 22T of the core atop the ridge structure and the top 25T of the slab layer will receive any significant ion dose. The sides 12 of the ridge structure 11, and in the case illustrated in FIG. 1C, any portion of core layer 20 covering the sides 12 of the ridge structure 11, are almost parallel to the ion beam and will not be doped. Standard ion implantation methods used in semiconductor device fabrication can be used to implant rare earth and other dopant species used in core layer 20. It has been experimentally confirmed by observation of increase in refractive index, that ion implantation can serve as the source of a photoluminescent dopant.

Figure 6:
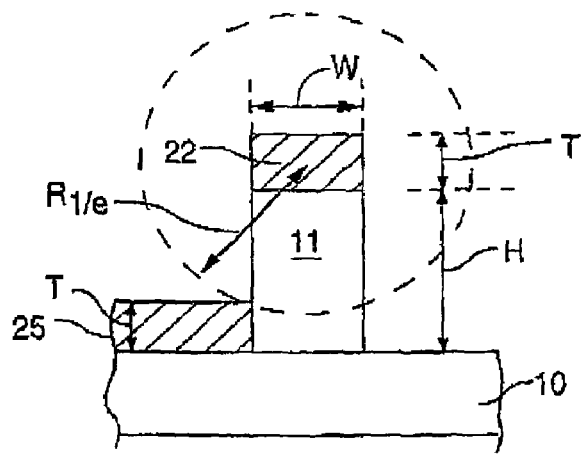
FIG. 6 is an idealized lighthouse waveguide structure according to embodiments of the present invention.

We term the as-deposited waveguide structure shown in FIGS. 4A and 4B a lighthouse structure. A model lighthouse structure is illustrated in FIG. 6 where the core 22 has thickness T and width W, and the ridge structured lower cladding 11 has a height H and width W. A slab of core material 25 of thickness T is also included in FIG. 6, representing an as-deposited condition. The lighhouse waveguide structure frequently, but not necessarily, includes an upper cladding layer overlying the core layer and slab layer (not shown.) An upper limit to the core dimensions to give single mode propagation for light of a given wavelength can be computed as a function of $\Delta n$ between core and cladding materials. The wavelengths of interest for optical communication applications are the communications wavelengths around 1550 and 1300 nm and the amplifier pump laser wavelength around 980 nm. In modeling the waveguide behavior, we use the pump laser wavelength which provides the most stringent conditions on the core dimensions.

The height H of the lower cladding ridge structure 11 is chosen to provide sufficient separation between the core 22 and the slab layer of core material 25 on the substrate. One way of specifying the height H is based on the so-called 1/e radius, $R_{1/e}$. In a plot of light intensity of a light beam versus distance from the beam center in the direction perpendicular to the propagation direction, $R_{1/e}$, is defined as the distance from the center at which the light intensity is reduced to 1/e of its peak intensity. For beams whose intensity profiles have the form of a Gaussian function, at least 80% of the light intensity is contained within the 1/e radius. A minimum value of H is given, for example, by the requirement that $R_{1/e}$ in FIG. 6, measured from the center of the core, does not intersect the slab layer 25. Intensity coupled into the slab layer 25 between ridge structures 11, provides a mechanism for undesired coupling, or crosstalk, between adjacent devices on the same substrate.

A general idea of useful dimensions for a lighthouse waveguide structure can be obtained by modeling the propagation of light beams through a structure consisting of a core of width W and height T, as defined in FIG. 6, and completely surrounded by a lower index cladding material. The modeling calculations involve solving the standard Helmholtz equation in cylindrical coordinates. The radius $R_{1/e}$ for a square core (W=T) of the maximum dimension to give single mode propagation at 980 nm is given below in Table 1 as a function of the refractive index difference between the core and cladding material. A minimum ridge height $H_{min}$ is approximated such that the 1/e radius lies above a slab layer of height T.

TABLE 1

Lighthouse waveguide dimensions*

| $\Delta n/n_{core}$ (%) | W = T (μm) | 1/e radius (μm) | $H_{min}$ (μm) |
|---|---|---|---|
| 0.4 | 6 | 4 | 7 |
| 0.5 | 4 | 3.8 | 5.8 |
| 1 | 3 | 2.8 | 4.3 |
| 2 | 1.8 | 2 | 2.9 |
| 4 | 1.3 | 1.5 | 2.2 |
| 6 | 1 | 1.2 | 1.7 |
| 8 | 0.8 | 1 | 1.4 |

*Calculated using the BPM program (Optiwave, Ottawa, Ontario, Canada)

As described above, when sputtering including substrate bias is used to deposit the core layer of a structure having a ridge 11 of height H that is greater than twice the core thickness T, there is some separation between the core layer 22 and the slab layer 25. According to the model calculations, for differences in refractive index between core and cladding layers characteristic of practical devices, the ratio of the height $H_{min}$ to the thickness T is typically greater than 1 and less than 2. The criterion for separation of core and slab layers by bias sputtering of H>2T ensures the center of the core is separated from the slab layer by more than the radius $R_{1/e}$. As described above, bias sputtering provides films with superior material properties for use in optical devices. Also, as long as the thickness of any core material on the sidewalls of the ridge is less than T, the core material on the sidewalls will not support single mode propagation. From these considerations, an advantageous lighthouse waveguide is obtained when bias sputtering is used to deposit a core layer of thickness T on a ridge structure of height H for structures where H is greater than T or greater than 1.5 T. A further advantage is obtained when bias sputtering is used for deposition of core material of thickness T on a ridge structure with a sidewall angle in the intermediate range of between about 30 and about 45 degrees and a height H greater than 2T, to produce a lighthouse waveguide structure with a complete separation between the core portion and the slab portion.

Although the calculations in Table 1 assumed a square core layer, the results are generally applicable to core layers with aspect ratios different from 1, having about the same area as the square core layer. For non-square core layers, typically it is desirable to have the width of the core layer greater than the thickness. Aspect ratios, W:T are generally no greater than about 3. Since the thickness of the slab layer is the same as the thickness of the core layer, aspect ratios greater than 1 have the benefit of providing thinner slab layers. For core layers that do not have a rectangular cross section, such as generic core layer 20 in FIG. 1C or core layer 22 in FIGS. 4A and 4B, a characteristic core width is taken as the width W' at a position in the middle of the core layer.

The waveguide dimensions listed in Table 1, particularly the ridge height $H_{min}$, are chosen to limit coupling or leakage into surface slab layer 25. To further minimize, coupling or leakage, the process flow of FIG. 2 can optionally be augmenting with a step in which some or all of the slab layer of core material is removed by etching through a photoresist mask.

The benefits of the present process that provides waveguiding structures with exceptionally low surface roughness can be appreciated from the model lighthouse structure and modeling results of Table 1. Using the values in Table 1, it can be seen that for the structures modeled here, a circle of radius $R_{1/e}$, in the cross section of FIG. 6 lies outside the core. Scattering due to surface roughness at interfaces between materials of different refractive index is an important loss mechanism in optical waveguides. As discussed in the background section, surface roughness of core sidewalls has previously been identified as a significant problem. In fact, roughness at any interface between different materials, for example, roughness at the interface between the top surface 16 of the ridge structured lower cladding and the underside of the core, is also a source of scattering loss. The above modeling results indicate, for many practical waveguide designs, non negligible light intensity is incident on the core sidewalls and core top and bottom edges. Therefore, the present as-deposited fabrication process that avoids etching of core sidewalls, or of the top surface 16 of lower cladding ridge structures 11, overcomes a significant problem in building low loss optical devices. The present process is particularly beneficial when combined with the deposition processes described here that produce exceptionally dense, smooth optical materials.

For waveguide designs with weakly guided modes, there is a significant intensity in the evanescent mode, outside the core. In these designs, the interface between the edge of the ridge structured lower cladding layer and the surrounding material is another important source of scattering loss. It may be useful, therefore, in these cases, to modify the fabrication process to address the smoothness of the sidewalls of the lower cladding ridge structures.

Although for some waveguides, a thermal oxide layer atop a silicon wafer may itself serve as a lower cladding layer, for purposes of refractive index matching, it is often necessary to deposit a layer of a controlled refractive index material. One approach to providing smoother lower cladding ridge sidewalls is to deposit a layer of low index material by the wide area target RF sputtering process described here. It is preferable to use a process selected for densification such as the dual frequency RF and/or substrate bias processes. A sputtered layer on the order of about 5 to 10 μm in thickness is suitable depending on the waveguide design. Ridge structures are then etched in the lower cladding layer as described previously. The dense, smooth film produced by the wide area RF sputtering process will have lower surface roughness after etch than a conventionally sputtered index matching layer. In this way, the ridge structures 11 will have smoother sidewalls in the top portion illuminated by the guided beam.

Figure 7:
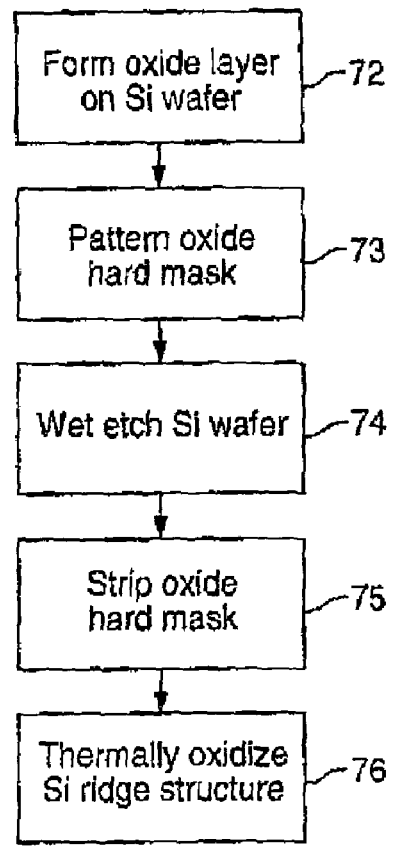
FIG. 7 is a flowchart of a process of forming a lower cladding ridge structure by wet etching of a silicon wafer.

A second approach to providing smoother lower cladding ridge sidewalls is to use a wet etching process to pattern oriented silicon wafers followed by thermal oxidizing the etched ridges. A process flow for this alternative approach to providing a ridge structured lower cladding layer is given in FIG. 7. At step 72, a thermal or deposited oxide layer is formed on a silicon wafer to serve as a hard mask for etching the silicon wafer. The thermal oxide layer is patterned at step 73, using a standard photolithography and etching process, and the photoresist layer is removed.

Figure 8:
FIG. 8 is an SEM image of a ridge structure formed by the process illustrated in FIG. 7.

Next, at step 74, the ridge structure is etched into the silicon wafer using a potassium hydroxide solution. The pattern is oriented on the silicon wafer to take advantage of the crystal structure of the silicon. For example, on a <110> oriented silicon wafer, trenches between the ridge structures can be oriented along the <111> directions. The thermal oxide hard mask is removed at step 74 and the silicon ridge structure is thermally oxidized at step 76 to form the ridge structured lower cladding layer. Fabrication of a waveguide by etching a silicon wafer and thermally oxidizing the etched ridges is described below in Example 5. The smoothness of the sidewalls of the etched silicon structures can be observed in the scanning electron micrograph of FIG. 8.

The second approach may alternatively be modified as follows. At step 72, an oxide layer thick enough to serve as the top part of the ridge-structured lower cladding is deposited, instead of a photomask layer. The etching process, step 74, includes first, an anisotropic etch through the top oxide layer forming the top of the ridge-structured cladding with straight sidewalls. Then an undercutting etch through the silicon layer is performed such that when the silicon is thermally oxidized in the subsequent step, the width of the cladding ridge will expand forming an advantageous sidewall slope below the ridge structure.

The features and benefits of the present methods of forming as-deposited waveguides and amplifiers are further illustrated in the following examples which are offered by way of illustration but not of limitation.

EXAMPLE 1

Single and Dual Frequency RF Sputter Deposition of Silica

Wide area target RF sputter deposition of materials for core and cladding layers of as-deposited waveguide structures is demonstrated in Example 1. An AKT 1600 series PVD production reactor (Applied Komatsu Technology, Santa Clara, Calif.) modified to accept custom ceramic tile targets was used for RF sputter deposition of $SiO_2$. A wide area target of dimension 550×650 mm was fabricated as described in the '307 application, from four fused silica tiles, each 4 mm thick, Corning code 9780 glass (Corning Inc. Elmira, N.Y.). For deposition, silicon wafers were placed on a Corning code 1739 glass carrier sheet opposite the target. A race-track shaped magnet of approximate dimension 150 mm×600 mm was swept over the face of the target at a rate of 4 seconds per one-way scan (8 seconds per complete cycle.)

High frequency (13.56 MHz) and low frequency (about 350 kHz) process powers are listed along with surface roughness and refractive index (RI) of the deposited films in Table 2. below. Depositions were all conducted at Ar flow rates of 40 standard cubic centimeters per minute (sccm) and at or near room temperature, except as noted below. Refractive index at 1.5 µ/m was measured using a Film Tek 4000 normal incidence interferometer (SCI, Encinitas, Calif.). Average surface roughness, $R_a$, was determined from Atomic Force Microscopy (AFM) measurements using a NanoScope III 5000 instrument (Digital Instruments, Veeco Metrology Group, Santa Barbara, Calif.)

TABLE 2

Average Surface Roughness and Refractive Index of RF Sputtered Silica

| EXAMPLE | HF Power (kW) | LF Power (kW) | $R_a$ (nm) | RI | Total Power | LF/HF Power Ratio |
|---|---|---|---|---|---|---|
| A | 2.3 | — | 2.988 | 1.4492 | 2.300 | 0 |
| B | 2.3 | — | 2.804 | 1.4494 | 2.300 | 0 |
| C | 2.3 | — | 3.412 | 1.4473 | 2.300 | 0 |
| D | 2.0 | 0.350 | 1.818 | 1.4538 | 2.350 | 0.175 |
| E | 2.0 | 0.350 | 1.939 | 1.4533 | 2.350 | 0.175 |
| F | 2.0 | 0.350 | 2.007 | 1.4547 | 2.350 | 0.175 |
| G | 2.0 | 0.350 | 2.571 | 1.4520 | 2.350 | 0.175 |
| H | 1.7 | 0.600 | 1.729 | 1.4560 | 2.300 | 0.353 |
| I | 1.7 | 1.000 | 1.445 | 1.4617 | 2.700 | 0.588 |
| J | 3.0 | 0.525 | 2.359 | 1.4542 | 3.525 | 0.175 |
| K* | 2.0 | 0.350 | 3.419 | 1.4523 | 2.350 | 0.175 |
| L# | 3.0 | 0.525 | 4.489 | 1.4449 | 3.525 | 0.175 |

*Deposition temperature 225° C.
Ar flow rate 120 sccm

Films deposited with a single frequency RF process (Examples A-C) had average surface roughness values in the range of 2.8 to 3.4 nm while the dual frequency process produced films with systematically lower average surface roughness of between 1.4 and 2.6 nm. Keeping other process conditions the same, increasing the ratio of low frequency to high frequency power is seen to result in decreasing surface roughness. Refractive index is observed to have the opposite proportional dependence on power ratio; increasing the low frequency power contribution results in films with higher refractive index. Beneficially, the higher refractive index material has the lower average surface roughness. Thus, in similar processes, core layer material can be obtained by using dual frequency deposition without use of dopants to modify the index of either layer, while using only the high frequency component produces a material of lower refractive index suitable for the cladding layer.

EXAMPLE 2

RF Sputter Deposition of Silica with Substrate Bias

An AKT 4300 series PVD production reactor (Applied Komatsu Technology, Santa Clara, Calif.) modified to accept custom ceramic tile targets and modified to induce a voltage on the substrate was used to deposit silica on planar and patterned 100 mm silicon wafers. A wide area target of dimension 750×870 mm was fabricated as described in the '307 application, from four fused silica tiles, each 4 mm thick, Corning code 9780 glass (Corning Inc. Elmira, N.Y.). The wafers were placed in the center of a Corning code 1739 glass carrier sheet opposite the target. The reactor was operated in the diode sputtering mode, without magnetic enhancement, at a high frequency RF power of 2500 W and an induced voltage of −400V. A bias voltage of −125 V at 2 MHz and 250 W was induced on the substrate. An argon gas flow rate of 160 sccm was used.

Average surface roughness of a 0.75 μm thick film deposited on a planar wafer, determined as in Example 1, was 0.14 nm. The refractive index determined as the average of measurements at 12 points on the surface was 1.4622 with a uniformity, defined as the difference of the minimum and maximum values divided by twice the average, of $3.4 \times 10^{-5}$ percent. To the best knowledge of the inventors, the exceptional uniformity reported here exceeds that of any vacuum deposited film reported previously.

Figure 5:
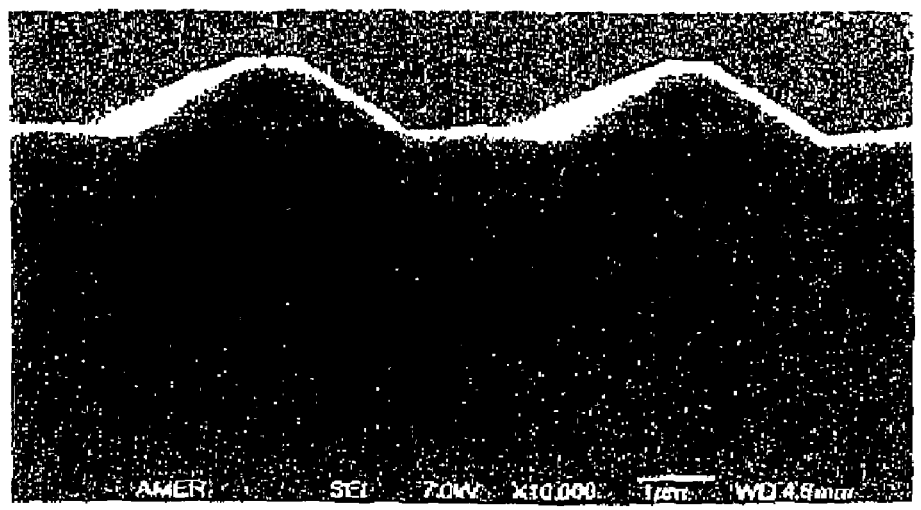
FIG. 5 is a scanning electron micrograph (SEM) image of a layer deposited by the process including applying RF power to the substrate.

FIG. 5 shows an SEM image of a silica film deposited over a patterned substrate. The trenches in the patterned substrate are seen to be completely and uniformly filled and the ridges are uniformly covered. The top surface of the layer overlying the ridges is flat and the sloping sides of the layer overlying the ridges are nominally at 45 degree angles. All of the foregoing geometric features are characteristic of bias sputtering deposition. As reported in the '307 application, for trench features with unit aspect ratio, the maximum thickness at the bottom of the trench of films deposited by conventional RF sputtering is less than about 10-20%.

EXAMPLE 3

Reactive DC Sputter Deposition of Alumina

The AKT 1600 series reactor as in Example 1 was operated with a Pinnacle Plus+ pulsed DC power supply (Advanced Energy Industries, Inc., Fort Collins, Colo.) and an aluminum target to deposit a film of alumina on a silicon wafer. 3 kW of process power was applied at a pulsing frequency of 60 kHz with a reverse pulsing time of about 2.5 μsec. The cathodic voltage was −400 V while the reverse voltage was on the order of +40 V. The argon flow rate was 26 sccm. The $O_2$ flow rate of 22 sccm, was the minimum amount of oxygen needed to produce stoichiometric alumina, $Al_2O_3$. The as-deposited alumina film had a refractive index of 1.699 and an index uniformity of 0.01%.

The reactive DC sputtering process was used to deposit alumina films from an aluminum target under different process conditions. Process power, reverse pulsing time, Ar low rate, and $O_2$ flow rate were as reported above, except for Example G in which an $O_2$ flow rate of 35 sccm was used. The refractive index and thickness of as-deposited alumina films, as well as the refractive index, after a 30 minute anneal at 800° C. are reported in Table 3 below.

sure to annealing temperatures. The maximum change in refractive index on anneal was 0.3%. Further, the reactive index of the as-deposited film can be modified by changing the deposition process conditions. Refractive index increases with increasing pulsing frequency and with increasing ratio of oxygen to argon.

EXAMPLE 4

As-Deposited Waveguide Amplifier

As-deposited planar amplifiers were formed on 100 mm silicon wafers having a 5 μm thick top layer of thermal oxide. Lower cladding ridges spaced 250 μm apart, extending across the wafers, were etched into the thermal oxide layers through masks having line widths of 5, 6, 7, and 8 μm. The etching process produced ridges having a partly trapezoidal structure as depicted in FIG. 1A, in which both the top and bottom widths were narrower than the line width of the mask, as typically obtained in dry etching.

A 0.6 μm thick core layer of silica containing Er and Yb ions was deposited over the ridge structures in the thermal oxide by single frequency RF sputtering of an alloy target having a composition of 57.5% $SiO_2$, 37.5% $Al_2O_3$, 2.5% $Er_2O_3$, and 2.5% $Yb_2O_3$. The AKT 1600 series reactor was used. A 7 μm thick silica top cladding layer was deposited over the core layer using the same reactor with the silica target of Example 1. Process conditions and refractive index for the core layer and the upper cladding layer are given below in Table 4.

TABLE 4

Deposition of Core and Cladding Layers of Waveguide Amplifier

|  | Core Layer | Cladding Layer |
| --- | --- | --- |
| High Frequency RF Power (kW) | 2 | 3 |
| Low Frequency RF Power (kW) | — | 0.525 at 350 kHz |
| Ar flow rate (sccm) | 40 | 120 |
| Carrier sheet temperature (° C.) | 350 | 350 |
| Refractive Index | 1.5497 | 1.453 |

After deposition of the upper cladding layer, the wafers were annealed at 800° C. for 30 minutes and then diced into waveguide amplifier segments of various lengths. As given by the refractive index data in Table 4, the waveguide amplifiers had a Δn between core and cladding layers of 6%. Fibers

TABLE 3

Refractive Index and Thickness of Reactive DC Sputtered Alumina

| EXAMPLE | $O_2$/Ar Ratio | Frequency (kHz) | Refractive Index* | Refractive Index* (post-anneal) | Thickness* (nm) |
| --- | --- | --- | --- | --- | --- |
| A | 0.846 | 60 | 1.6970(0.0018) |  | 207.21(0.45) |
| B | 0.846 | 60 | 1.6973(0.0019) | 1.6980(0.0058) | 209.61(0.40) |
| C | 0.846 | 60 | 1.6971(0.0007) |  | 697.02(2.44) |
| D | 0.846 | 60 | 1.6983(0.0014) |  | 687.84(2.56) |
| E | 0.846 | 100 | 1.7116(0.0020) |  | 192.05(0.61) |
| F | 0.846 | 200 | 1.7314(0.0019) | 1.7328(0.0027) | 167.00(0.67) |
| G | 1.346 | 60 | 1.7243(0.0043) | 1.7187(0.0044) | 171.19(0.44) |

*Standard deviation (1σ) in parentheses

As can be seen from the results of Table 3, the refractive index of reactive DC sputtered alumina is stable upon expocarrying signal wavelengths 1300 nm and pump laser light at 980 nm were coupled to the amplifier segments. Evidence of guiding light through a 15 mm amplifier segment fabricated from a mask having a linewidth of 5 µm (core size of about 2.5×0.7 µm) was provided by an image of the fundamental mode of the transmitted 980 nm pump laser light. A pump laser power of 27 mW was used. Internal signal enhancement through 12 mm amplifier segments was found to increase as a function of waveguide width to a value of 6-7 dB/cm, after subtraction of the passive absorption, for the widest amplifiers measured (mask width 8 µm.) The present example demonstrate single mode transmission, together with significant signal gain can be obtained from an as-deposited waveguide structure where the core is formed without an etching step on a pre-formed ridge structure.

EXAMPLE 5

As-Deposited Waveguide by Forming Ridge Structures in Silicon Wafer

This example illustrates forming a ridge structured lower cladding layer by etching a silicon wafer. A 0.3 µm thick silicon dioxide layer was formed on an <110> oriented 100 mm silicon wafer by thermal oxidation at about 1100° C. A layer of photoresist was formed on the $SiO_2$ etch mask layer and patterned to define ridges of about 3 µm in width and 80-100 mm in length, extending across the wafer, with spacings between the ridges of 4-20 µm. The $SiO_2$ layer was patterned by a hydrofluoric acid (HF) etch and the photoresist layer stripped by standard techniques. The silicon wafer was etched to a depth of from 4 µm to 15 µm in a controlled manner, depending on etch time, using a potassium hydroxide solution. The $SiO_2$ mask was stripped and the wafer was cleaned with HF followed by a deionized water rinse. The patterned ridges were thermally oxidized to silicon dioxide forming the ridge structured lower cladding layer with a refractive index of about 1.445. In this way, tall ridges of silicon dioxide were formed by a short thermal oxidation process compared to the time required to form a similar thickness of a planar thermal oxide layer. After wet etch, surface roughness was defined by the spacing of single crystallographic planes formed on the sidewalls. After oxidation, average surface roughness was about 0.2 nm.

A layer of core material is deposited over the ridge structured lower cladding layer by a dual frequency RF process, generally as described in Example 1. The high frequency RF power is 1 kW and low frequency RF power at 225 kHz was 0.5 kW. An argon flow rate of 35 sccm is used. The refractive index of the core material is 1.450. The upper cladding layer having a refractive index of 1.445 was deposited over the core layer by a single frequency RF process in which the process power was 1 kW. The present method of forming a passive single mode waveguide of pure silaceous material on a silicon wafer could be advantageously used to provide single mode optical interconnections to microelectronic devices.

EXAMPLE 6

Ion-Implantation of Sputtered Silica $Er^{2+}$ and $Al^+$ ions were implanted into a 10 µm thick layer of dual frequency RF sputtered silica at an erbium dose of $5\times10^{15}/cm^2$ at 400 to 900 keV and an aluminum dose of $5\times10^{16}/cm^2$ at 120 to 180 keV. The resulting film was analyzed by Rutherford back scattering. A peak erbium concentration was observed at a depth of 0.25 to 0.30 µm at an implantation energy of 900 keV. By the rule of mixtures, the observed refractive index increase is equivalent to a several percent change in refractive index for a 10 µm thick film. A sputtered overcladding of silica was used to form a waveguide of the implanted portion. Guided light and signal enhancement was observed.

Although the present invention has been described in terms of specific materials and conditions, the description is only an example of the invention's application. Various adaptations and modifications of the processes disclosed are contemplated within the scope of the invention as defined by the following claims.

We claim:

1. A process of fabricating a planar optical device, the process comprising:
    forming a plurality of ridge structures in a lower cladding layer of a first material, wherein:
        the lower cladding layer has a first refractive index; and
        each of the plurality of ridge structures has a top surface and sidewalls;
    simultaneously depositing and etching a core layer over the plurality of ridge structures to form an intermediate structure, the core layer comprising a core material having a second refractive index greater than the first refractive index,
        wherein the core layer completely and continuously covers an entire surface of the top surface, an entire surface of the sidewalls, and an entire surface of horizontal surfaces between each of the plurality of ridge structures; and
    depositing an upper cladding layer over the intermediate structure, the upper cladding layer comprising an upper cladding material having a third refractive index less than the second refractive index.

2. The process of claim 1 wherein depositing the core layer comprises:
    depositing the core layer by a physical vapor deposition process wherein at least one of the plurality of ridge structures is positioned opposite a target comprising the core material and a first radio frequency power is applied to the target at a first frequency in the presence of a gas such that a uniform plasma condition is created in the vicinity of the target; and
    sputtering material from the target onto at least one of the plurality of ridge structures.

3. The process of claim 2 wherein depositing the core layer further comprises
    applying a second radio frequency power to at least one of the plurality of ridge structures.

4. The process of claim 2 wherein depositing the core layer further comprises
    applying a third radio frequency power to the target, wherein the third radio frequency power is applied at second frequency which is smaller than the first frequency.

5. The process of claim 1 wherein depositing the upper cladding layer comprises
    depositing the upper cladding layer by a physical vapor deposition process wherein the intermediate structure is positioned opposite a cladding target composed of the upper cladding material and a second radio frequency power is applied to the cladding target in the presence of a gas such that a uniform plasma condition is created in the vicinity of the target, sputtering material from the cladding target onto the intermediate structure.

6. The process of claim 5 wherein depositing the upper cladding layer further comprises
    applying a third radio frequency power to the intermediate structure.

7. The process of claim 1 wherein the layer of core material has an average surface roughness of less than about 3 nanometers.

8. The process of claim 1 wherein forming the ridge structure in the layer of the first material comprises:
   etching at least one of the plurality of ridge structures in a silicon wafer; and
   exposing the etched silicon wafer to an oxidizing atmosphere under conditions wherein a portion of silicon of the silicon wafer undergoes a reaction to convert at least the ridge structure to a silica ridge structure, thereby forming the layer of a first material on the silicon wafer.

9. A process of fabricating a planar optical device, the process comprising:
   forming a plurality of ridge structures in a lower cladding layer of a first material, wherein:
      the lower cladding layer has a first refractive index; and
      each of the plurality of ridge structures has a top surface and sidewalls;
   simultaneously depositing and etching a core layer over the plurality of ridge structures to form an intermediate structure, the core layer comprising a core material having a second refractive index greater than the first refractive index,
      wherein the core layer completely and continuously covers an entire surface of the top surface, an entire surface of the sidewalls, and an entire surface of horizontal surfaces between each of the plurality of ridge structures;
   depositing an upper cladding layer over the intermediate structure, the upper cladding layer comprising an upper cladding material having a third refractive index less than the second refractive index;
   wherein depositing the core layer comprises depositing the core layer by a physical vapor deposition process, wherein at least one of the plurality of ridge structures is positioned opposite a central region of a target, wherein the target comprises the central region and outer regions, the central region comprising the core material and the outer regions comprising material of lower refractive index than the core material, and wherein a first radio frequency power is applied to the target in the presence of a gas such that a uniform plasma condition is created in the vicinity of the target and sputtering material from the target onto at least one of the plurality of ridge structures.

10. The process of claim 9 wherein depositing the core layer further comprises
    applying a second radio frequency power to at least one of the plurality of ridge structures.

11. The process of claim 9 wherein the core layer comprises a core portion disposed overlying the top surface, a slab portion overlying horizontal surface, and a sidewall portion disposed on the sidewalls, and wherein the sidewall portion comprises material of the outer regions of the target.

12. A method of fabricating a planar optical device, the method comprising:
    forming a plurality of ridge structures in a layer of cladding material, wherein:
       each of the plurality of ridge structures has a top surface and sidewalls;
    forming an intermediate structure by simultaneously depositing and etching core material overlying the plurality of ridge structures by a physical vapor deposition process in which, in the presence of a background gas, a first radio frequency power is applied to a sputtering target comprising the core material and a second radio frequency power is applied to at least one of the plurality of ridge structures
       wherein the core layer completely and continuously covers an entire surface of the top surface, an entire surface of the sidewalls, and an entire surface of horizontal surfaces formed between each ridge structure of the plurality of ridge structures; and
    depositing an upper cladding layer over the intermediate structure, the upper cladding layer comprising a second cladding material, wherein
       the refractive index of the core material is greater than the refractive index of the first cladding material and of the second cladding material.

* * * * *